United States Patent
Sakakibara

(10) Patent No.: US 11,558,571 B2
(45) Date of Patent: Jan. 17, 2023

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventor: Masaki Sakakibara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 110 days.

(21) Appl. No.: 17/250,352

(22) PCT Filed: Apr. 11, 2019

(86) PCT No.: PCT/JP2019/015793
§ 371 (c)(1),
(2) Date: Jan. 8, 2021

(87) PCT Pub. No.: WO2020/017115
PCT Pub. Date: Jan. 23, 2020

(65) Prior Publication Data
US 2021/0321055 A1    Oct. 14, 2021

(30) Foreign Application Priority Data

Jul. 19, 2018    (JP) ............................. JP2018-135972

(51) Int. Cl.
*H04N 5/374*    (2011.01)
*H04N 5/3745*    (2011.01)
(Continued)

(52) U.S. Cl.
CPC ....... *H04N 5/3743* (2013.01); *H04N 5/37455* (2013.01)

(58) Field of Classification Search
None
See application file for complete search history.

(56) References Cited

U.S. PATENT DOCUMENTS

| 2011/0248371 A1 | 10/2011 | Matsumura et al. |
| 2013/0087687 A1 | 4/2013 | Hiyama et al. |
| 2018/0175083 A1* | 6/2018 | Takahashi ............. H04N 5/378 |

FOREIGN PATENT DOCUMENTS

| CN | 102214669 A | 10/2011 |
| JP | 2007-251325 A | 9/2007 |

(Continued)

OTHER PUBLICATIONS

International Search Report and Written Opinion of PCT Application No. PCT/JP2019/015793 dated Jul. 2, 2019, 08 pages of ISRWO.

*Primary Examiner* — Mark T Monk
(74) *Attorney, Agent, or Firm* — Chip Law Group

(57) ABSTRACT

A solid-state imaging element including a well improves area efficiency while reducing malfunction of a circuit on the well. The solid-state imaging element includes a first well, a second well, a first circuit, and a second circuit. The first well contains an impurity having a polarity identical to a polarity of an impurity in a substrate. The second well contains an impurity having a polarity identical to the polarity of the impurity in the substrate and is disposed adjacent to the first well. The first circuit is disposed on the first well and generates noise in a predetermined period. The second circuit is disposed on the second well and generates noise in a period different from the predetermined period.

9 Claims, 20 Drawing Sheets

(51) Int. Cl.
*H04N 5/369* (2011.01)
*H01L 27/146* (2006.01)

(56) References Cited

FOREIGN PATENT DOCUMENTS

| | | |
|---|---|---|
| JP | 2008-16612 A | 1/2008 |
| JP | 2011-222708 A | 11/2011 |
| JP | 2013-085103 A | 5/2013 |

* cited by examiner

SOLID-STATE IMAGING ELEMENT AND IMAGING DEVICE

CROSS REFERENCE TO RELATED APPLICATIONS

This application is a U.S. National Phase of International Patent Application No. PCT/JP2019/015793 filed on Apr. 11, 2019, which claims priority benefit of Japanese Patent Application No. JP 2018-135972 filed in the Japan Patent Office on Jul. 19, 2018. Each of the above-referenced applications is hereby incorporated herein by reference in its entirety.

TECHNICAL FIELD

The present technology relates to a solid-state imaging element and an imaging device. Specifically, the present technology relates to a solid-state imaging element which includes a circuit disposed on a well, and an imaging device.

BACKGROUND ART

A solid-state imaging element or the like conventionally adopts a triple-well structure to reduce noise. This triple-well structure is such a structure which includes a substrate (e.g., N-type substrate), a well (e.g., P-well) disposed on the substrate and having a polarity opposite to a polarity of the substrate, and a well (e.g., N-well) disposed on the opposite-polarity well in an island shape and having a polarity identical to the polarity of the substrate. For example, there has been proposed such a solid-state imaging element which includes a P-well formed on an N-type substrate, an N-well disposed on the P-well, and a pixel circuit disposed on these wells (e.g., see PTL 1).

CITATION LIST

Patent Literature

PTL 1

JP 2007-251325A

SUMMARY

Technical Problem

According to the conventional technology described above, the N-well which has a polarity identical to the polarity of the N-type substrate is provided on the P-well having an opposite polarity. In this case, noise reduction is achievable by insulating and separating an element on the N-well from the substrate. However, when a plurality of wells (e.g., N-wells) having a polarity identical to the polarity of the substrate (e.g., N-type substrate) is disposed adjacent to each other on the substrate, noise may be transmitted from one side to the other side of a circuit on the N-wells due to non-separation of the N-wells from the substrate. In this case, malfunction of the circuit may be caused by the noise. Reduction of the noise is achievable by removing the N-wells from the substrate. However, reduction of the circuit on the N-wells is further needed. Accordingly, a proportion of a circuit area to a substrate area, i.e., area efficiency of the circuit decreases. Accordingly, the solid-state imaging element described above has such a problem that reduction of malfunction caused by noise and improvement of area efficiency are difficult to simultaneously achieve.

The present technology has been developed in consideration of the aforementioned circumstances. An object of the present technology is to provide a solid-state imaging element including a well and configured to improve area efficiency while reducing malfunction of a circuit on the well.

Solution to Problem

The present technology has been developed to solve the aforementioned problems. A first aspect of the present technology is directed to a solid-state imaging element including a first well that contains an impurity having a polarity identical to a polarity of an impurity in a substrate, a second well that contains an impurity having a polarity identical to the polarity of the impurity in the substrate and that is disposed adjacent to the first well, a first circuit that is disposed on the first well and generates noise in a predetermined period, and a second circuit that is disposed on the second well and generates noise in a period different from the predetermined period. Accordingly, an effect of reducing malfunction of the first circuit and the second circuit caused by noise is produced.

In addition, in the first aspect, the first circuit may include an analog-digital converter that converts an analog signal into a digital signal in the predetermined period. Accordingly, an effect of reducing malfunction of the analog-digital converter is produced.

In addition, in the first aspect, there may be further provided a time code generation unit that counts a count value and generates a time code indicating the count value in synchronization with a clock signal having a frequency variable with an elapse of time. The analog-digital converter may include a comparator that compares the analog signal with a predetermined reference signal and outputs a comparison result, and a data storage unit that stores the time code at a time of inversion of the comparison result as the digital signal. Accordingly, an effect of reducing power consumption of the time code generation unit is produced.

In addition, in the first aspect, the second circuit may include a memory that retains data and updates the data in a period different from the predetermined period. An effect of reducing malfunction of the memory is produced by providing the time code generation unit as a common component for a plurality of comparators and data retaining units.

In addition, in the first aspect, the second circuit may include an output control unit that outputs data in a period different from the predetermined period. Accordingly, an effect of reducing malfunction of the output control unit is produced.

In addition, in the first aspect, there may be further provided a third well that contains an impurity having a polarity opposite to the polarity of the impurity in the substrate, and a control circuit that is disposed on the third well and controls operations of the first circuit and the second circuit. Accordingly, an effect of reducing malfunction of the first circuit and the second circuit caused by noise generated from the control circuit.

In addition, in the first aspect, there may be further provided a pixel circuit that generates an analog signal by photoelectric conversion. The pixel circuit may be disposed on a predetermined light reception chip. The first circuit and the second circuit may be disposed on a chip laminated on the light reception chip. Accordingly, an effect of reducing a circuit scale per chip is produced.

In addition, in the first aspect, the first circuit and the second circuit may be dispersedly disposed on a plurality of circuit chips laminated on the light reception chip. Accordingly, an effect of reducing a circuit scale per chip is produced.

In addition, a second aspect of the present technology is directed to an imaging device including a first well that contains an impurity having a polarity identical to a polarity of an impurity in a substrate, a second well that contains an impurity having a polarity identical to the polarity of the impurity in the substrate and that is disposed adjacent to the first well, a first circuit that is disposed on the first well and generates noise in a predetermined period, a second circuit that is disposed in the second well and generates noise in a period different from the predetermined period, and a pixel circuit that generates a predetermined analog signal by photoelectric conversion and supplies the generated predetermined analog signal to the first circuit. Accordingly, an effect of generating an analog signal and reducing malfunction of the first circuit and the second circuit caused by noise is produced.

Advantageous Effects of Invention

According to an excellent advantageous effect produced by the present technology, a solid-state imaging element including a well and capable of improving area efficiency while reducing malfunction of a circuit on the well is provided. Note that advantageous effects to be produced are not necessarily limited to the advantageous effect described herein, but may be any advantageous effects described in the present disclosure.

DESCRIPTION OF EMBODIMENTS

Modes (hereinafter referred to as embodiments) for carrying out the present technology will be hereinafter described. Description will be presented in a following order.

1. First embodiment (example of arrangement of two circuits having different operation periods on P-wells adjacent to each other)

2. Second embodiment (example of arrangement of ADC and output control unit having different operation periods on wells adjacent to each other)

3. Third embodiment (example of arrangement of two circuits having different operation periods on P-wells adjacent to each other in triple-layer laminated structure)

4. Fourth embodiment (example of arrangement of two circuits having different operation periods on P-wells adjacent to each other with frequency of clock signal varied)

5. Application example to mobile body

1. First Embodiment

Configuration Example of Imaging Device

Figure 1:
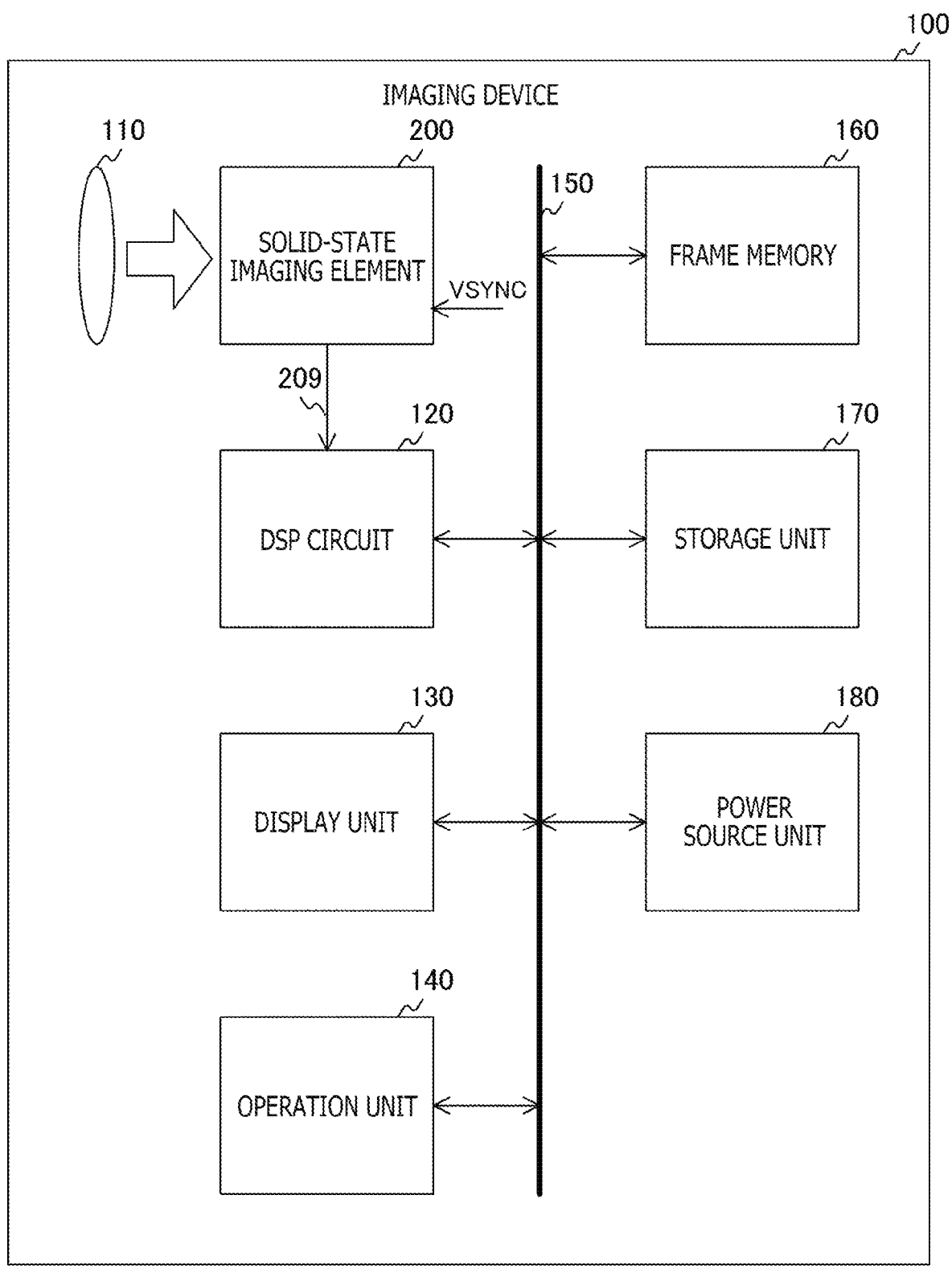
FIG. 1 is a block diagram depicting one configuration example of an imaging device according to a first embodiment of the present technology.

FIG. 1 is a block diagram depicting one configuration example of an imaging device 100 according to a first embodiment of the present technology. The imaging device 100 is a device for capturing image data, and includes an optical unit 110, a solid-state imaging element 200, and a DSP (Digital Signal Processing) circuit 120. The imaging device 100 further includes a display unit 130, an operation unit 140, a bus 150, a frame memory 160, a storage unit 170, and a power source unit 180. For example, it is assumed that the imaging device 100 is a digital camera such as a digital still camera, or a smartphone, a personal computer, an in-vehicle camera, or the like having an imaging function.

The optical unit 110 converges light received from an object and guides the converged light toward the solid-state imaging element 200. The solid-state imaging element 200 generates image data by photoelectric conversion in synchronization with a vertical synchronized signal VSYNC. The vertical synchronized signal VSYNC herein is a periodic signal having a predetermined frequency and indicating imaging timing. The solid-state imaging element 200 supplies the generated image data to the DSP circuit 120 via a signal line 209.

The DSP circuit 120 executes predetermined signal processing for the image data received from the solid-state imaging element 200. The DSP circuit 120 outputs the processed image data to the frame memory 160 and the like via the bus 150.

The display unit 130 displays image data. For example, it is assumed that the display unit 130 is a liquid crystal panel or an organic EL (Electro Luminescence) panel. The operation unit 140 generates an operation signal according to an operation received from a user.

The bus 150 is a common route provided for mutual data exchange between the optical unit 110, the solid-state imaging element 200, the DSP circuit 120, the display unit 130, the operation unit 140, the frame memory 160, the storage unit 170, and the power source unit 180.

The frame memory 160 retains image data. The storage unit 170 stores various data such as image data. The power source unit 180 supplies power source to the solid-state imaging element 200, the DSP circuit 120, the display unit 130, and others.

Configuration Example of Imaging Device

Figure 2:
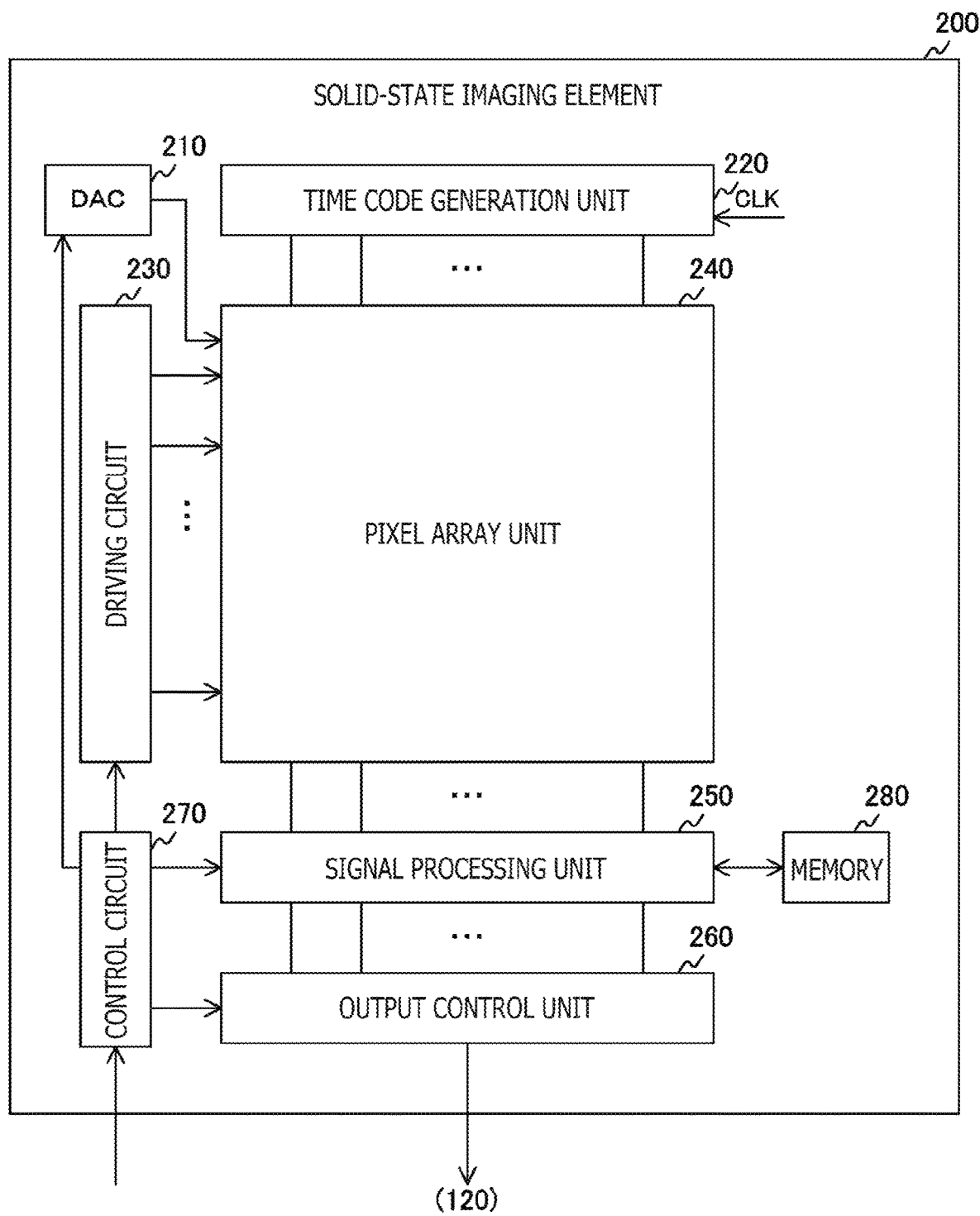
FIG. 2 is a block diagram depicting one configuration example of a solid-state imaging element according to the first embodiment of the present technology.

FIG. 2 is a block diagram depicting one configuration example of the solid-state imaging element 200 according to the first embodiment of the present technology. The solid-state imaging element 200 includes a DAC 210, a time code generation unit 220, a driving circuit 230, a pixel array unit 240, a signal processing unit 250, an output control unit 260, a control circuit 270, and a memory 280. Moreover, a plurality of pixels is arranged in the pixel array unit 240 in a two-dimensional grid shape. Hereinafter, a set of pixels arranged in the pixel array unit 240 in a predetermined direction will be referred to as a "row," while a set of pixels arranged in the pixel array unit 240 in a direction perpendicular to the row will be referred to as a "column."

The DAC 210 performs DA (Digital to Analog) conversion to generate an analog reference signal which changes in a slope shape. The DAC 210 supplies the reference signal to the pixel array unit 240.

The time code generation unit 220 generates a time code. This time code indicates a time included in a period in which the reference signal changes in the slope shape. For example, the time code generation unit 220 counts a count value in synchronization with a clock signal having a fixed frequency and received from the control circuit 270, and generates data indicating the count value as a time code. The time code generation unit 220 supplies the generated time code to the pixel array unit 240.

The driving circuit 230 drives pixels in the pixel array unit 240 under control by the control circuit 270.

The signal processing unit 250 performs predetermined signal processing such as correlated double sampling (CDS) for pixel data. The image data constituted by the processed pixel data is supplied to the output control unit 260.

The output control unit 260 outputs the image data to the outside such as the DSP circuit 120 under control by the control circuit 270.

The control circuit 270 controls operation timing of each of the DAC 210, the time code generation unit 220, the driving circuit 230, the pixel array unit 240, the signal processing unit 250, the output control unit 260, and the memory 280.

The memory 280 retains data and exchanges data with the signal processing unit 250 under control by the control circuit 270. In a case of issue of a data reading instruction, the memory 280 outputs retained data as data retained therein to the signal processing unit 250. In a case of issue of a data writing instruction, the memory 280 updates the retained data on the basis of data input from the signal processing unit 250. For example, an SRAM (Static Random Access Memory) is used as the memory 280.

Figure 3:
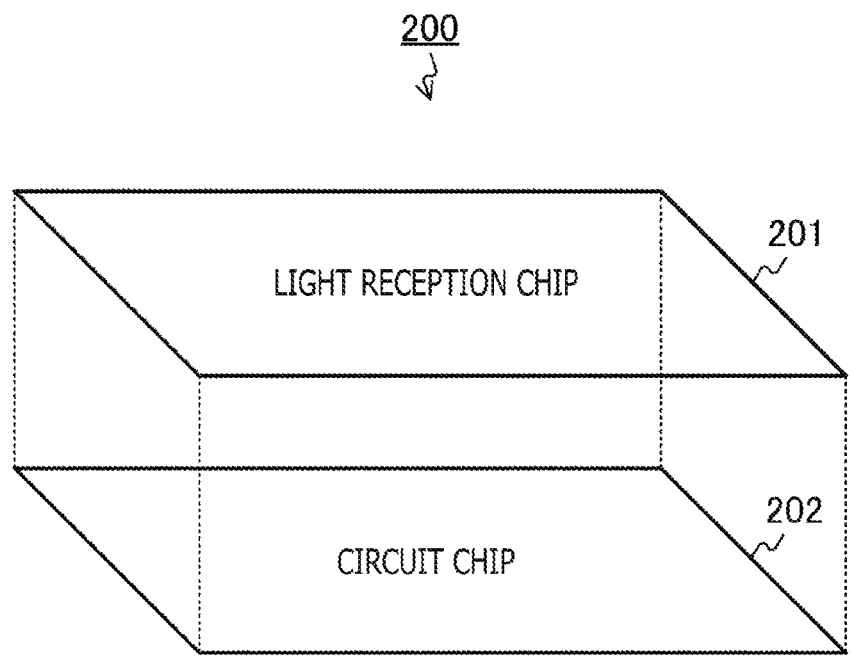
FIG. 3 is a diagram depicting one example of a laminated structure of the solid-state imaging element according to the first embodiment of the present technology.

FIG. 3 is a block diagram depicting one example of a laminated structure of a sold-state imaging element 200 according to the first embodiment of the present technology. The solid-state imaging element 200 includes a circuit chip 202, and a light reception chip 201 laminated on the circuit chip 202. These chips are electrically connected to each other via a connection portion such as a via. Note that this connection may be made by an inductive coupling communication technology such as Cu—Cu bonding, bumping, and TCI (ThruChip Interface) as well as a via.

Configuration Example of Pixel Array Unit

Figure 4:
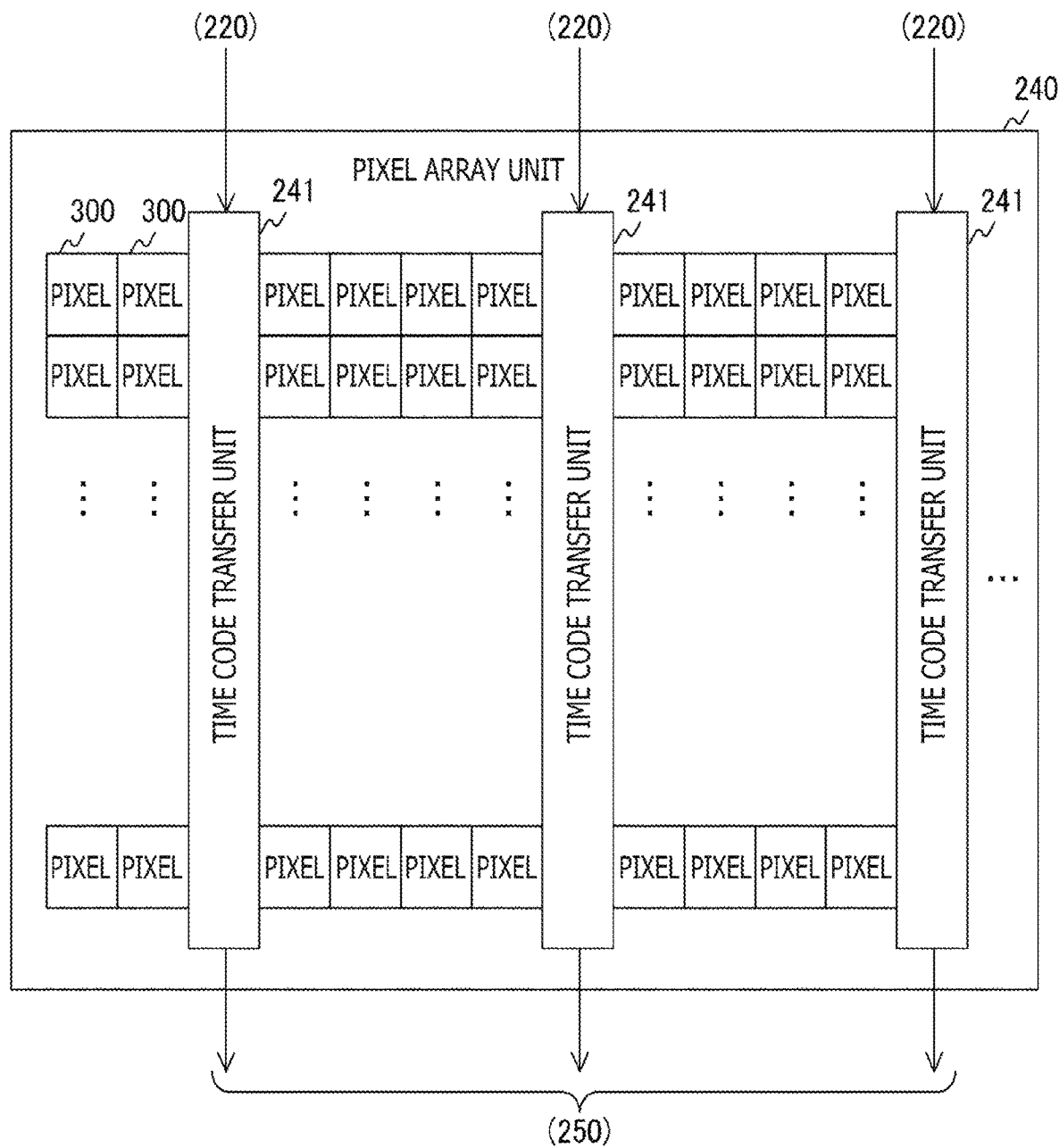
FIG. 4 is a plan diagram depicting one configuration example of a pixel array unit according to the first embodiment of the present technology.

FIG. 4 is a block diagram depicting one configuration example of the pixel array unit 240 according to the first embodiment of the present technology. The pixel array unit 240 includes a plurality of time code transfer units 241 and a plurality of pixels 300. In addition, the pixels 300 are arranged in a two-dimensional grid shape.

Each of the time code transfer units 241 transfers a time code received from the time code generation unit 220. Each of the time code transfer units 241 transfers the time code to the pixels 300 and also transfers time codes received from the pixels 300 to the signal processing unit 250 as digital pixel data.

Configuration Example of Pixel

Figure 5:
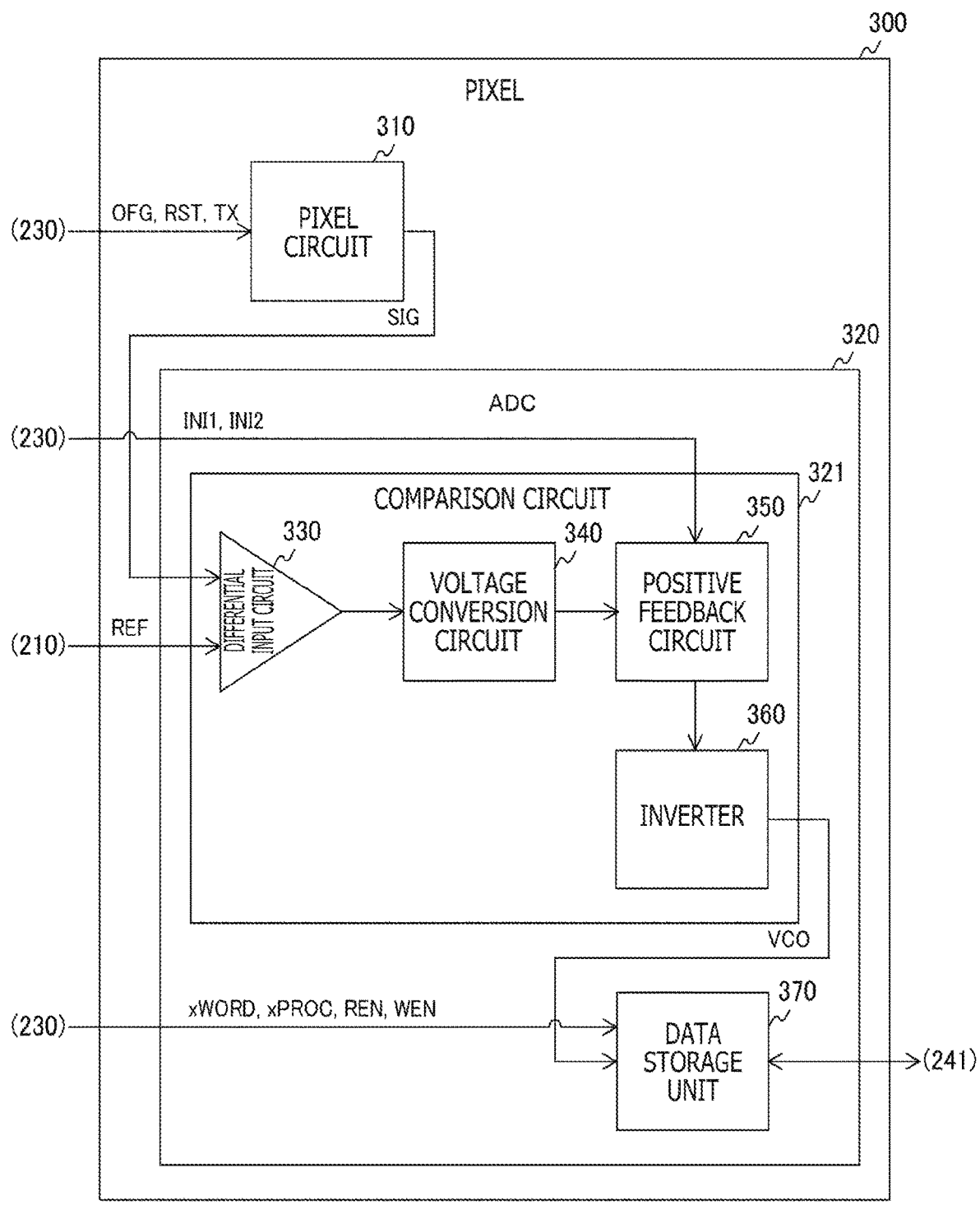
FIG. 5 is a block diagram depicting one configuration example of a pixel according to the first embodiment of the present technology.

FIG. 5 is a block diagram depicting one configuration example of the pixel 300 according to the first embodiment of the present technology. The pixel 300 includes a pixel circuit 310 and an ADC (Analog Digital Converter) 320. The ADC 320 includes a comparison circuit 321 and a data storage unit 370. In addition, the comparison circuit 321 includes a differential input circuit 330, a voltage conversion circuit 340, a positive feedback circuit 350, and an inverter 360.

The pixel circuit 310 generates an analog signal as a pixel signal SIG by photoelectric conversion. The pixel circuit 310 supplies the pixel signal SIG to the differential input circuit 330.

The ADC 320 converts the pixel signal SIG into a digital signal by AD conversion.

The differential input circuit 330 provided within the ADC 320 compares a reference signal REF received from the DAC 210 with the pixel signal SIG received from the pixel circuit 310. The differential input circuit 330 supplies a comparison result signal indicating a comparison result to the voltage conversion circuit 340.

The voltage conversion circuit 340 converts voltage of the comparison result signal received from the differential input circuit 330 and outputs the converted comparison result signal to the positive feedback circuit 350.

The positive feedback circuit 350 adds a part of an output to the input (comparison result signal) and supplies the signal thus obtained to the inverter 360.

The inverter 360 inverts the signal received from the positive feedback circuit 350, and outputs the inverted signal to the data storage unit 370 as an output signal VCO.

The data storage unit 370 retains a time code indicating a time of inversion of the output signal VCO.

Figure 6:
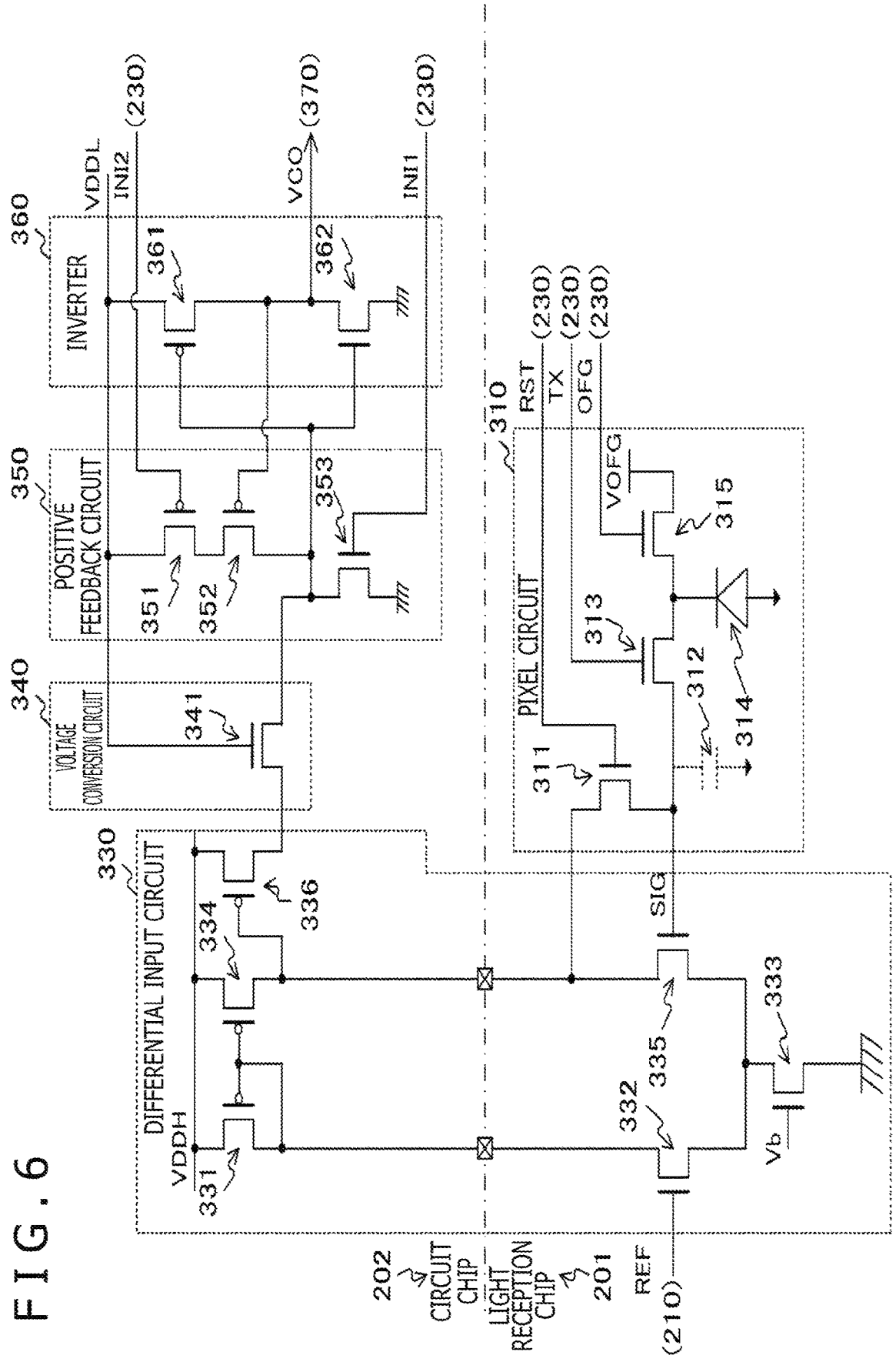
FIG. 6 is a circuit diagram depicting one configuration example of a pixel circuit, a differential input circuit, a voltage conversion circuit, a positive feedback circuit, and an inverter according to the first embodiment of the present technology.

FIG. 6 is a circuit diagram depicting one configuration example of the pixel circuit 310, the differential input circuit 330, the voltage conversion circuit 340, the positive feedback circuit 350, and the inverter 360 according to the first embodiment of the present technology.

The pixel circuit 310 includes a reset transistor 311, an FD (Floating Diffusion) 312, a transfer transistor 313, a photodiode 314, and a discharge transistor 315. For example, an N-type MOS (Metal-Oxide-Semiconductor) transistor is used as each of the reset transistor 311, the transfer transistor 313, and the discharge transistor 315.

The photodiode 314 generates charges by photoelectric conversion. The discharge transistor 315 discharges charges accumulated in the photodiode 314 at the time of an exposure start according to a driving signal OFG received from the driving circuit 230.

The transfer transistor 313 transfers charges from the photodiode 314 to the FD 312 at the time of an exposure end according to a transfer signal TX received from the driving circuit 230.

The FD 312 accumulates the transferred charges and generates voltage according to an amount of the accumulated charges.

The reset transistor 311 initializes the FD 312 according to a reset signal RST received from the driving circuit 230.

The differential input circuit 330 includes PMOS (Positive channel MOS) transistors 331, 334, and 336, and NMOS (Negative channel MOS) transistors 332, 333, and 335.

The NMOS transistors 332 and 335 constitute a differential pair. Sources of these transistors are connected to a common drain of the NMOS transistor 333. In addition, a drain of the NMOS transistor 332 is connected to a drain of the PMOS transistor 331 and gates of the PMOS transistors 331 and 334. A drain of the NMOS transistor 335 is connected to a drain of the PMOS transistor 334, a gate of the PMOS transistor 336, and a drain of the reset transistor 311. Moreover, the reference signal REF is input to a gate of the NMOS transistor 332.

A predetermined bias voltage Vb is applied to a gate of the NMOS transistor 333, while a predetermined ground voltage is applied to a source of the NMOS transistor 333. A gate of the NMOS transistor 335 is connected to the reset transistor 311, the FD 312, and the transfer transistor 313.

The PMOS transistors 331, 334, and 336 constitute a current mirror circuit. A power source voltage VDDH is applied to sources of the PMOS transistors 331, 334, and 336. The power source voltage VDDH is higher than a power source voltage VDDL. In addition, a drain of the PMOS transistor 336 is connected to the voltage conversion circuit 340.

Moreover, the pixel circuit 310 and the NMOS transistors 332, 333, and 335 are disposed on the light reception chip 201, while the other circuits are disposed on the circuit chip 202.

The voltage conversion circuit 340 includes an NMOS transistor 341. The power source voltage VDDL is applied to a gate of the NMOS transistor 341. In addition, a drain of the NMOS transistor 341 is connected to a drain of the PMOS transistor 336, while a source of the NMOS transistor 341 is connected to the positive feedback circuit 350. The voltage conversion circuit 340 converts the power source voltage VDDH into the power source voltage VDDL lower than the power source voltage VDDH and allows a circuit operating at a low voltage to be disposed in a following stage. Note that the configuration for converting the power source voltage VDDH into the power source voltage VDDL using the voltage conversion circuit 340 is not necessarily required to be adopted. For example, the power source voltages VDDH and VDDL may be equalized to eliminate the necessity of providing the voltage conversion circuit 340.

The positive feedback circuit 350 includes PMOS transistors 351 and 352 and an NMOS transistor 353. The inverter 360 includes the PMOS transistor 361 and the NMOS transistor 362. The PMOS transistors 351 and 352 are connected to the power source voltage VDDL in series. In addition, a driving signal INI2 is input from the driving circuit 230 to a gate of the PMOS transistor 351. A drain of the PMOS transistor 352 is connected to a source of the NMS transistor 341, a drain of the NMS transistor 353, and gates of the PMOS transistor 361 and the NMOS transistor 362.

The ground voltage is applied to a source of the NMOS transistor 353, while a driving signal INI1 is input from the driving circuit 230 to a gate of the NMOS transistor 353.

The PMOS transistor 361 and the NMOS transistor 362 are connected to the power source voltage VDDL in series. Moreover, an output signal VCO is output from a connection point between the PMOS transistor 361 and the NMOS transistor 362. Furthermore, the ground voltage is applied to a source of the NMOS transistor 362.

Note that each of the pixel circuit 310, the differential input circuit 330, the voltage conversion circuit 340, the positive feedback circuit 350, and the inverter 360 is not limited to the circuit depicted in FIG. 6 by way of example as long as the functions described with reference to FIG. 5 are provided.

In addition, the arrangement method for the respective chips is not limited to the above-described configuration arranged such that the pixel circuit 310 and a part of the differential input circuit 330 are disposed on the light reception chip 201, and that the remaining parts are disposed on the circuit chip 202. For example, only the pixel circuit 310 may be disposed on the light reception chip 201, and the differential input circuit 330 and the following stages may be disposed on the circuit chip 202.

Configuration Example of Data Storage Unit

Figure 7:
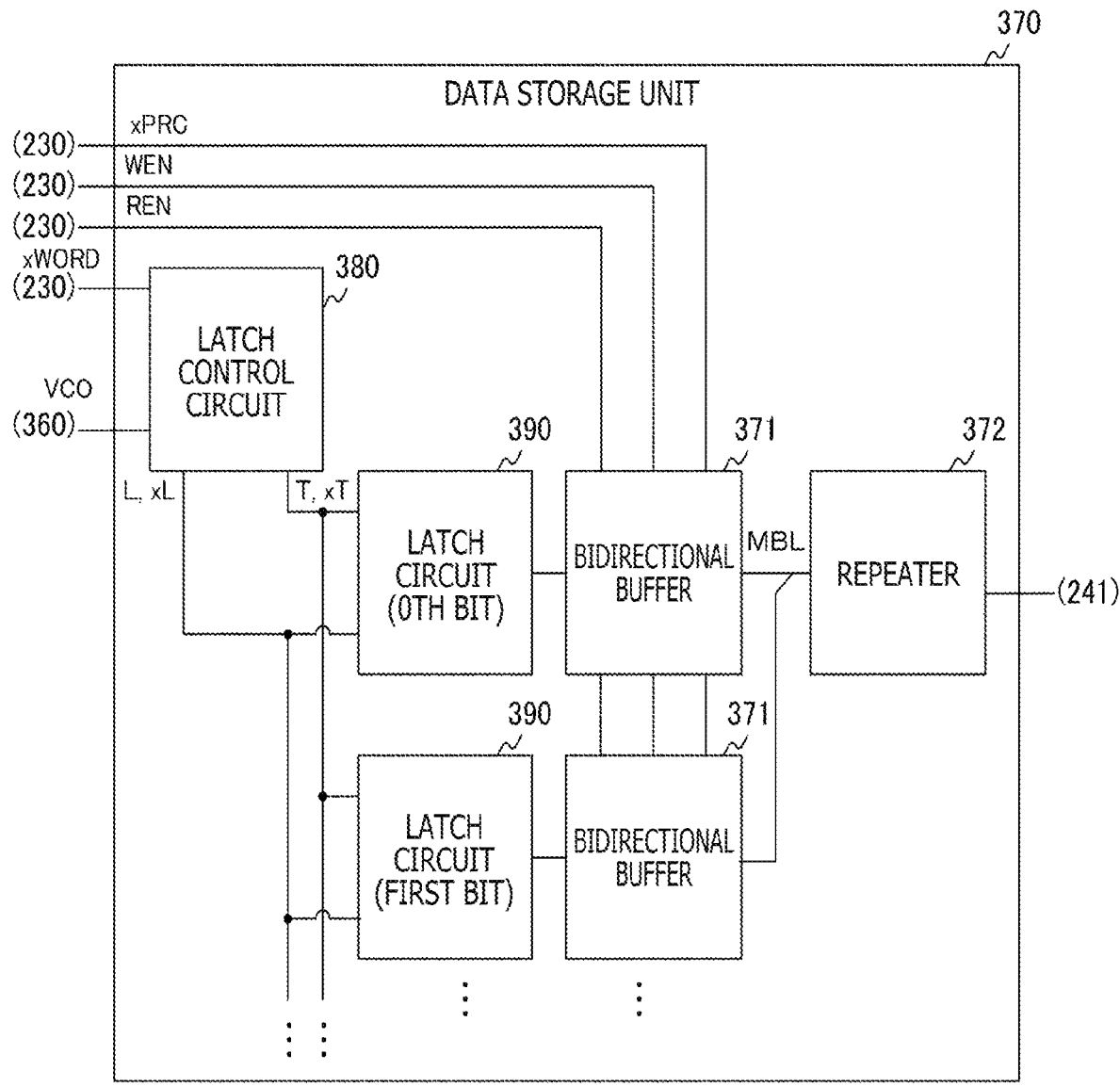
FIG. 7 is a block diagram depicting one configuration example of a data storage unit according to the first embodiment of the present technology.

FIG. 7 is a block diagram depicting one configuration example of the data storage unit 370 according to the first embodiment of the present technology. The data storage unit 370 includes a latch control circuit 380, latch circuits 390 as many as a bit number D (D: integer) of D-phase data, D bidirectional buffers 371, and a repeater 372. The latch control circuit 380 causes any one of the latch circuits 390 to retain a code value (logical value "0" or "1") input from the repeater 372 via the corresponding bidirectional buffer 371 according to a control signal xWORD received from the driving circuit 230 and an output VCO of a comparator.

Each of the latch circuits 390 retains a code value received from the repeater 372 under control by the latch control circuit 380. The bidirectional buffer 371 bidirectionally transfers data between the corresponding latch circuit 390 and the repeater 372 according to a control signal xPRC, a write enable WEN, and a read enable REN received from the driving circuit 320.

The repeater 372 is the time code transfer unit 241 itself.

Figure 8:
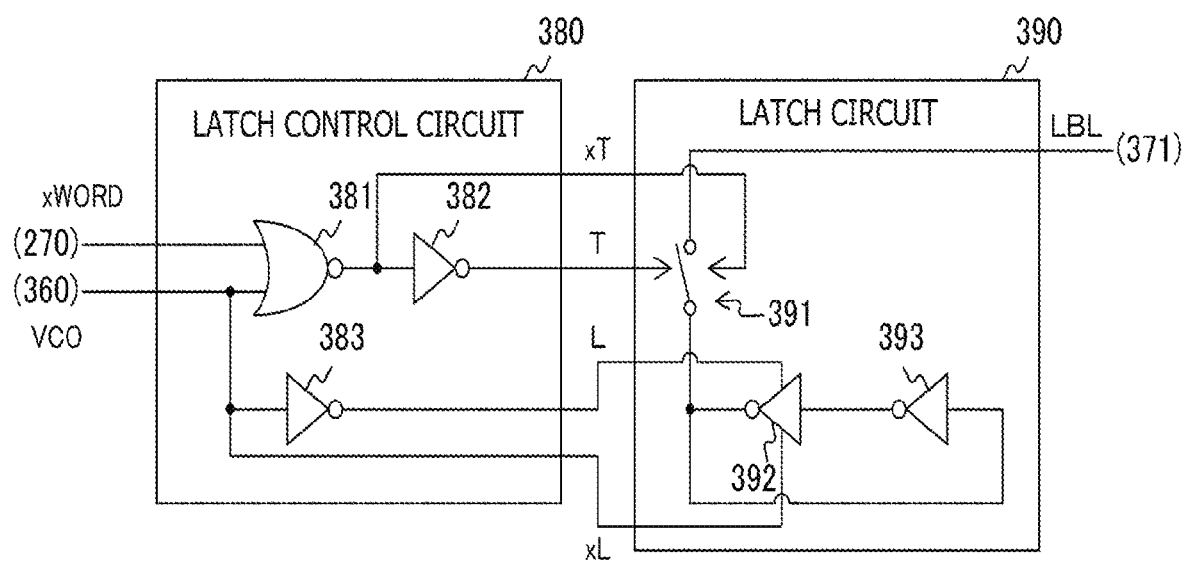
FIG. 8 is a circuit diagram depicting one configuration example of a latch control circuit and a latch circuit according to the first embodiment of the present technology.

FIG. 8 is a block diagram depicting one configuration example of the latch control circuit 380 and the latch circuit 390 according to the first embodiment of the present technology. The latch control circuit 380 includes an NOR gate 381 and inverters 382 and 383. In addition, the latch circuit 390 includes a switch 391 and inverters 392 and 393.

The NOR gate 381 outputs an NOR operation result of the control signal xWORD and the output signal VCO to the inverter 382 and the latch circuit 390 as a latch control signal xT. The inverter 382 inverts an output value received from the NOR gate 381 and outputs the inverted output value to the latch circuit 390 as a latch control signal T.

The inverter 383 inverts the output signal VCO and outputs the inverted output signal VCO to the latch circuit 390 as a latch control signal L. Further, the output signal VCO is supplied to the latch circuit 390 as a latch control signal xL.

The switch 391 opens and closes a route between the inverter 392 and a bit line LBL according to the latch control signals xT and T received from the latch control circuit 380. The bit line LBL is connected to the bidirectional buffer 371.

The inverter 392 inverts and outputs a signal received from the inverter 393 or brings the signal into a high-impedance state according to the latch control signals xL and L received from the latch control circuit 380.

The inverter 393 inverts a signal received from the inverter 392 and outputs the inverted signal to an input terminal of the inverter 392.

Note that each of the latch control circuit 380 and the latch circuit 390 is not limited to the circuit depicted in FIG. 8 by way of example as long as equivalent functions are provided.

Figure 9:
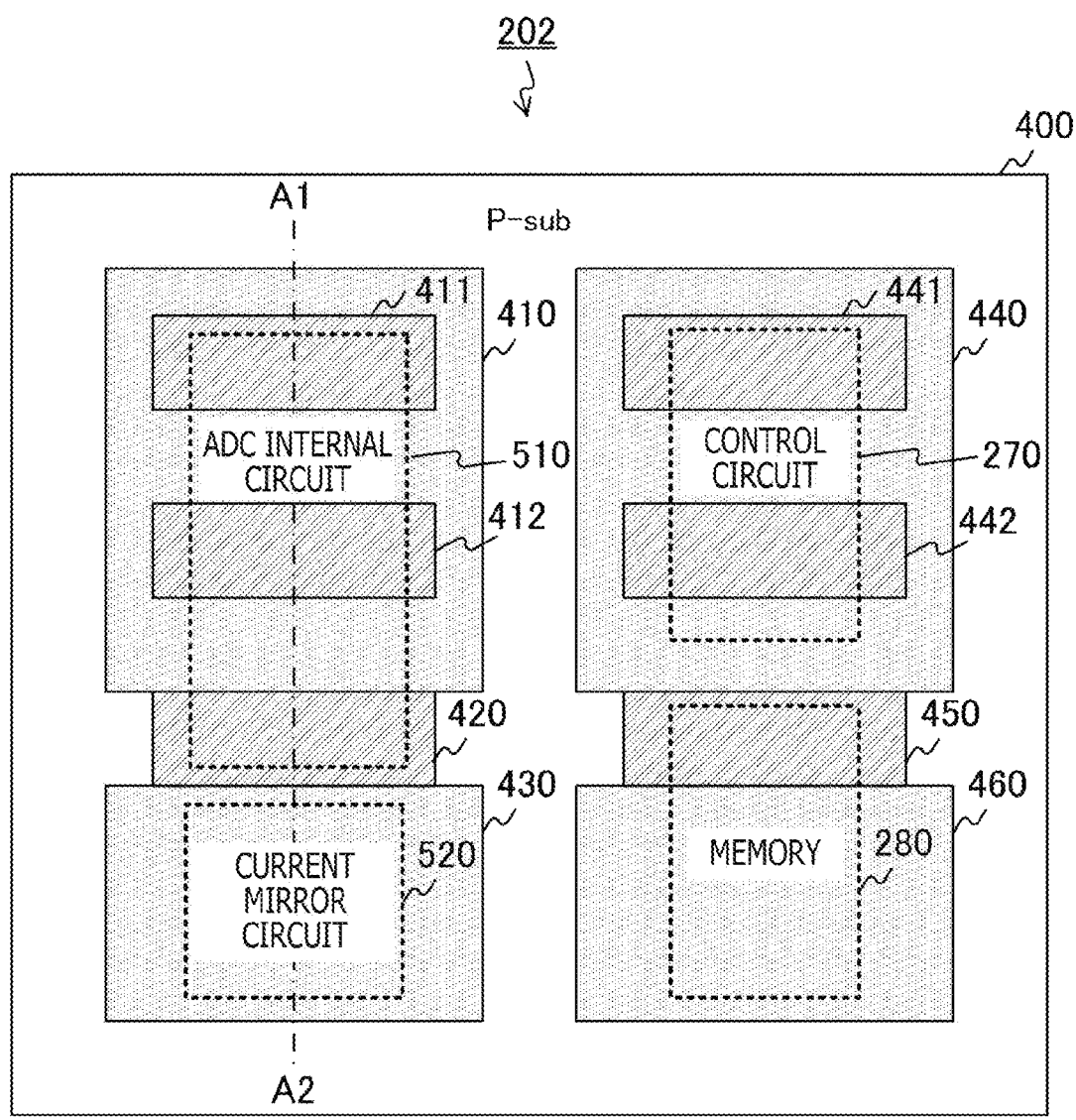
FIG. 9 is an example of a plan diagram depicting a P-type substrate according to the first embodiment of the present technology.

FIG. 9 is an example of a plan diagram depicting a P-type substrate 400 according to the first embodiment of the present technology. The P-type substrate 400 is provided on the circuit chip 202. A plurality of N-wells such as N-wells 410, 430, 440, and 460 is formed on the P-type substrate 400.

Moreover, a P-well 420 is formed between the N-well 410 and the N-well 430. A P-well 450 is formed between the N-wells 440 and 460 and adjacent to the P-well 420. P-wells 411 and 412 are formed within the N-well 410 in an island shape, while P-wells 441 and 442 are formed within the N-well 440 in an island shape.

Each of the N-wells such as the N-well 410 is a layer which contains N-type impurities having a polarity opposite to a polarity of impurities within the P-type substrate 400. Each of the P-wells such as the P-well 420 is a layer which contains P-type impurities having a polarity identical to the polarity of the impurities within the P-type substrate 400. An element such as an NMOS transistor is disposed on each of the P-wells, while an element such as a PMOS transistor is disposed on each of the N-wells.

Note that the N-well 440 is an example of a third well described in the patent claims. The P-well 420 is an example of a first well described in the patent claims, while the P-well 450 is an example of a second well described in the patent claims.

In addition, it is assumed that a horizontal direction parallel to a plane of the P-type substrate 400 is an X direction, and that a direction perpendicular to this plane is a Z direction. It is further assumed that a direction perpendicular to the X direction and the Z direction is a Y direction.

Each of the N-wells herein has a polarity different from the polarity of the P-type substrate 400. Accordingly, an element within each of the N-wells is insulated from surroundings, and therefore not affected by noise coming from peripheral circuits. Moreover, an element on the P-well (e.g., P-well 411) within each of the N-wells is also insulated from the N-well, and therefore not affected by noise. On the other hand, the P-well (e.g., P-well 420) on the P-type substrate 400 is not insulated, and therefore may cause malfunction by an effect of noise from the peripheral circuits.

Meanwhile, when an operation period in which noise is generated in the circuit on the P-well 420 overlaps with an operation period in which noise is generated in the circuit on the P-well 450 adjacent to the P-well 420, noise from one of these circuits may cause malfunction of the other circuit. For reducing this malfunction, circuits having noise-generated operation periods different from each other are disposed on the P-well 420 and the P-well 450 adjacent to each other.

The noise-generated operation period differs for each type of circuits. For example, noise is generated in the ADC 320 during a period of AD conversion. Noise is generated in the memory 280 during a period of update of retained data. Noise is generated in the control circuit 270 during a period of control of operation timing of the ADC 320 and the memory 280 in synchronization with a clock signal. Assuming that the foregoing operation periods of the ADC 320 and the memory 280 do not overlap with each other, an ADC internal circuit 510 within the ADC 320 is disposed on the N-well 420 and the P-well 450, and the memory 280 is disposed on the P-well 450 and the N-well 460, for example. Note that the circuits disposed on the P-wells 420 and 450 are not limited to a combination of the ADC internal circuit 510 within the ADC 320 and the memory 280 as long as the noise-generated operation periods differ from each other. In addition, the ADC 320 is an example of a first circuit described in the patent claims, while the memory 280 is an example of a second circuit described in the patent claims.

For example, the control circuit 270 is disposed on the N-well 440, while a current mirror circuit 520 within the ADC 320 is disposed on the N-well 430. The control circuit 270 becomes a noise source which generates noise during the operation periods of the ADC 320 and the memory 280. However, malfunction caused by noise is reduced in a state of separation between the control circuit 270 and the peripheral circuits by the N-well 440.

The current mirror circuit 520 corresponds to a circuit constituted by the PMOS transistors 331, 334, and 336 of the differential input circuit 330 depicted in FIG. 6 by way of example. Moreover, the ADC internal circuit 510 corresponds to a circuit included in the ADC 320 and disposed in a stage following the current mirror circuit 520.

While the wells are disposed in the P-type substrate 400, the wells may be disposed in an N-type substrate. In a case of use of the N-type substrate, P-wells are disposed at positions of the N-wells in the figure, and N-wells are disposed at positions of the P-wells in the figure.

Figure 10:
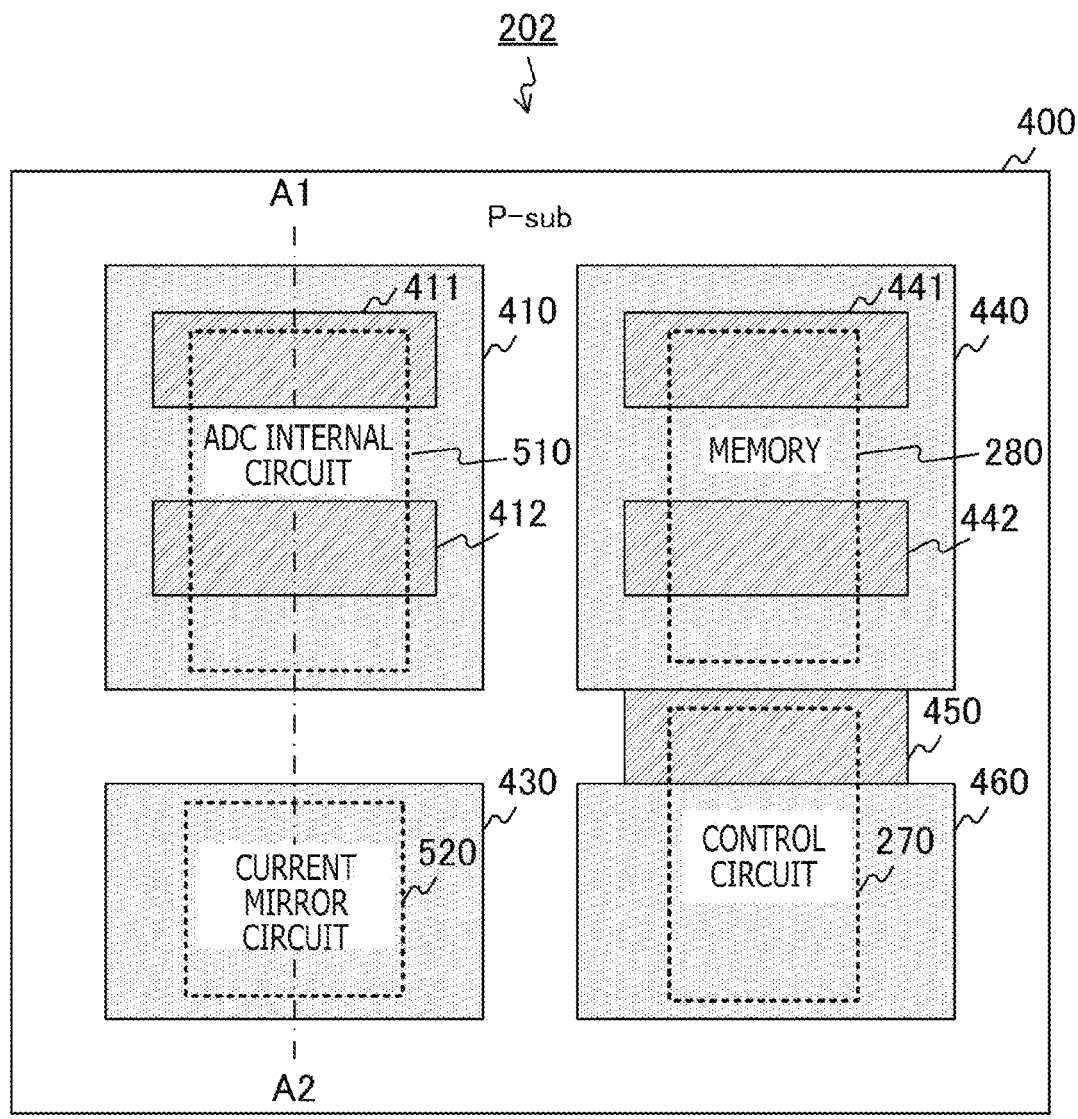
FIG. 10 is an example of a plan diagram depicting a P-type substrate according to a comparative example.

FIG. 10 is one example of a plan diagram depicting the P-type substrate 400 according to a comparative example. Assumed in the comparative example is a configuration that the control circuit 270 is disposed on the P-well 450 and the N-well 460. According to this comparative example, it is not allowed to dispose the P-well 420, and provide, on the P-well 420, the element on the ADC internal circuit 510. This arrangement is required because the P-well 450 is not separated from the peripheral circuits. In this condition, noise generated from the control circuit 270 may propagate and cause malfunction of the ADC internal circuit 510.

On the other hand, in the configuration where the memory 280 having an operation period different from that of the ADC 320 is disposed on the P-well 450, it is allowed to provide the P-well 420, and also dispose, on the P-well 420, the element within the ADC 320 as depicted in FIG. 9 by way of example. In this manner, area efficiency more improves than in the comparative example while reducing malfunction caused by noise.

Figure 11:
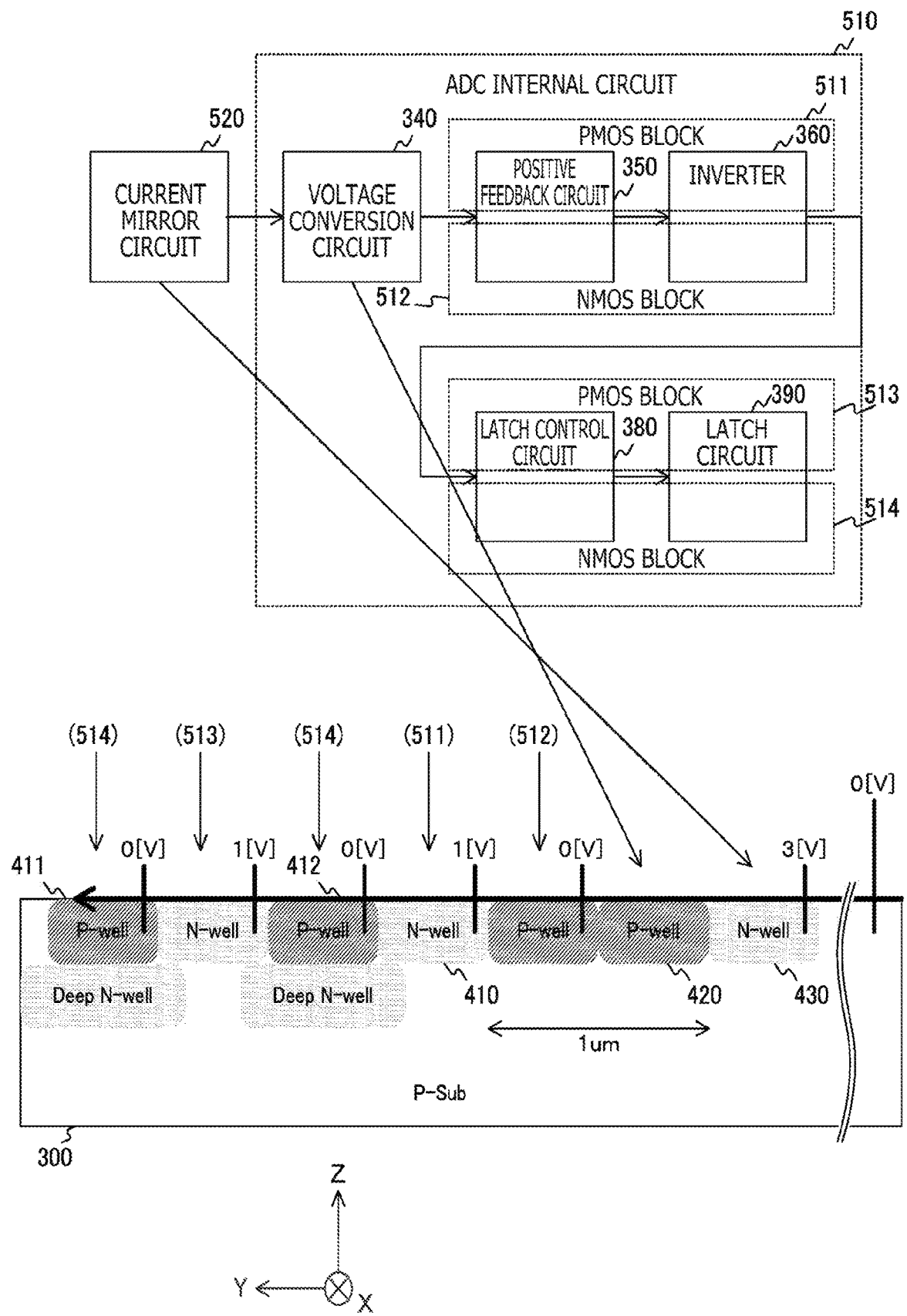
FIG. 11 is a diagram for explaining a circuit arrangement method for wells according to the first embodiment of the present technology.

FIG. 11 is a diagram for explaining a circuit arrangement method for wells according to the first embodiment of the present technology. A cross-sectional diagram in a lower part of the figure is a cross-sectional diagram of the P-type substrate 400 taken along an axis A1-A2 in FIG. 9.

In the ADC internal circuit 510, a PMOS transistor group within the positive feedback circuit 350 and the inverter 360 will be referred to as a PMOS block 511, and an NMOS transistor group within the positive feedback circuit 350 and the inverter 360 will be referred to as an NMOS block 512. In addition, a PMOS transistor group within the latch control circuit 380 and the latch circuit 390 will be referred to as a PMOS block 513, and an NMOS transistor group within the latch control circuit 380 and the latch circuit 390 will be referred to as an NMOS block 514.

For example, the NMOS transistors within the NMOS block 514 are disposed on the P-wells 411 and 412. For example, the PMOS transistors within the PMOS blocks 511 and 513 are disposed on the N-well 410. The NMOS transistors within the voltage conversion circuit 340 and the NMOS block 512 are disposed on the P-well 420. The PMOS transistors within the current mirror circuit 520 are disposed within the N-well 430.

Figure 12:
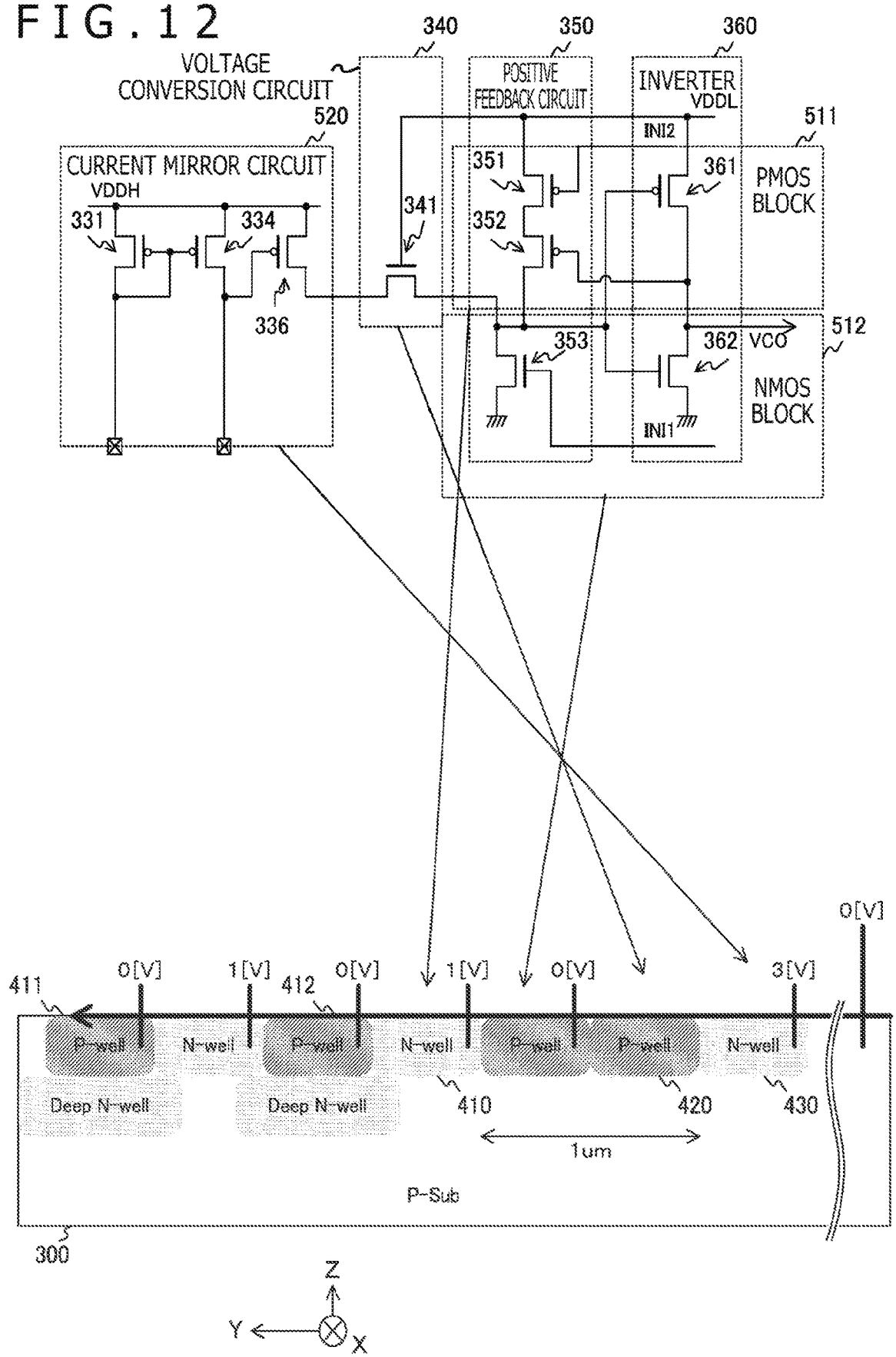
FIG. 12 is a diagram for explaining a transistor arrangement method for wells according to the first embodiment of the present technology.

FIG. 12 is a diagram for explaining a transistor arrangement method for wells according to the first embodiment of the present technology.

The PMOS transistors 331, 334, and 336 within the current mirror circuit 520 are disposed on the N-well 430. The NMOS transistor 341 within the voltage conversion circuit 340 and the NMOS transistors 353 and 362 within the NMOS block 512 are disposed on the P-well 420. The PMOS transistors 351, 352, and 361 within the PMOS block 511 are disposed on the N-well 410.

An allowable layout area of the ADC 320 is expandable if the P-well 420 has a length of 1 micrometer (μm) in the Y direction as a significant length in view of processing and allows an NMOS transistor to be disposed on this well.

Figure 13:
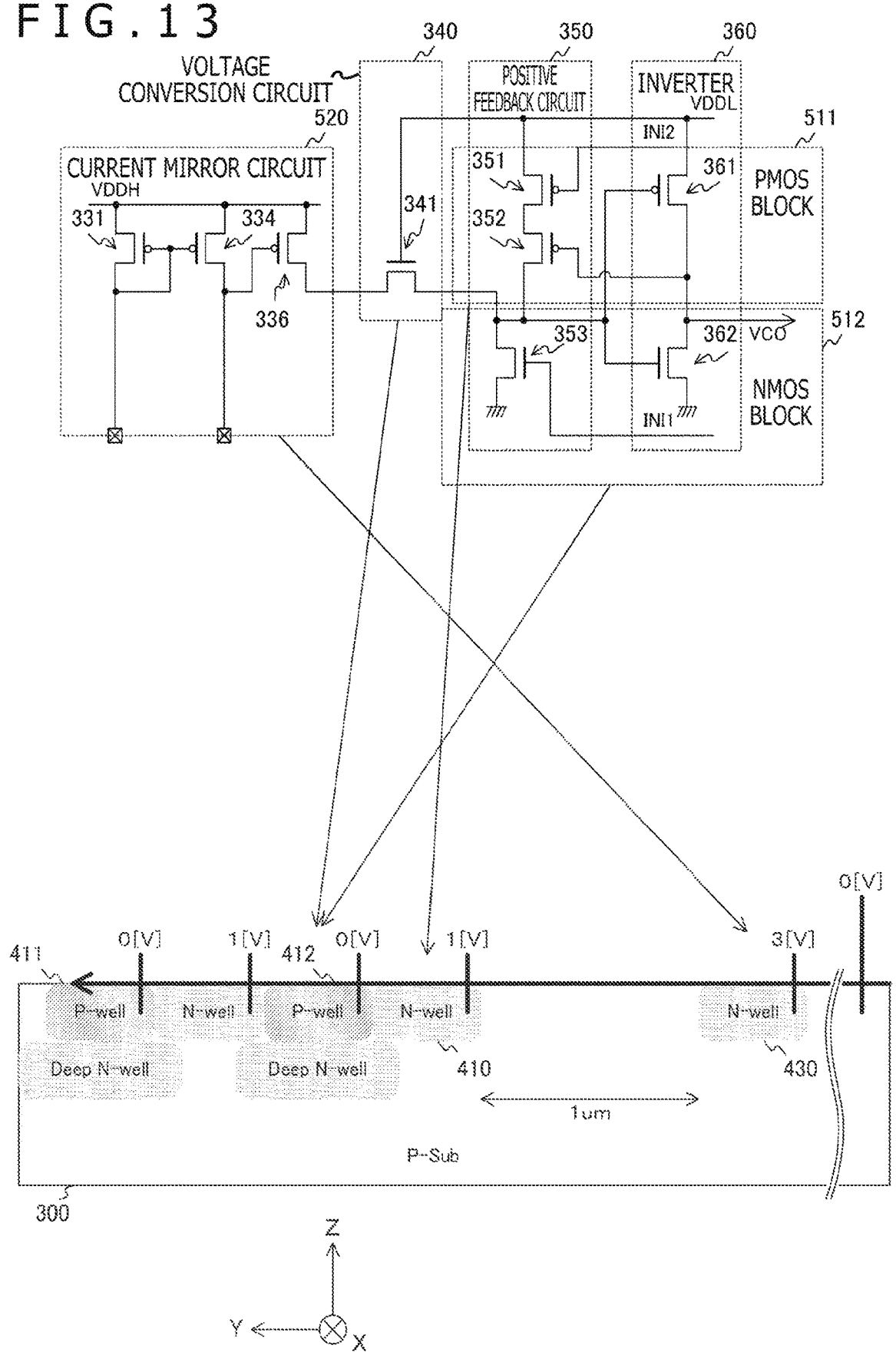
FIG. 13 is a diagram for explaining a transistor arrangement method for wells according to a comparative example.

FIG. 13 is a diagram for explaining a transistor arrangement method for wells according to a comparative example. In the comparative example, the PMOS transistors within the current mirror circuit 520 are disposed on the N-well 430. The NMOS transistors within the voltage conversion circuit 340 and the NMOS block 512 are disposed on the P-well 412. The PMOS transistors within the PMOS block 511 are disposed on the N-well 410. As depicted in the figure by way of example, the P-well 420 is not allowed to be provided so as to reduce noise effect in the comparative example. Accordingly, a portion between the N-wells 410 and 430 becomes a dead space.

Operation Example of Solid-State Imaging Element

Figure 14:
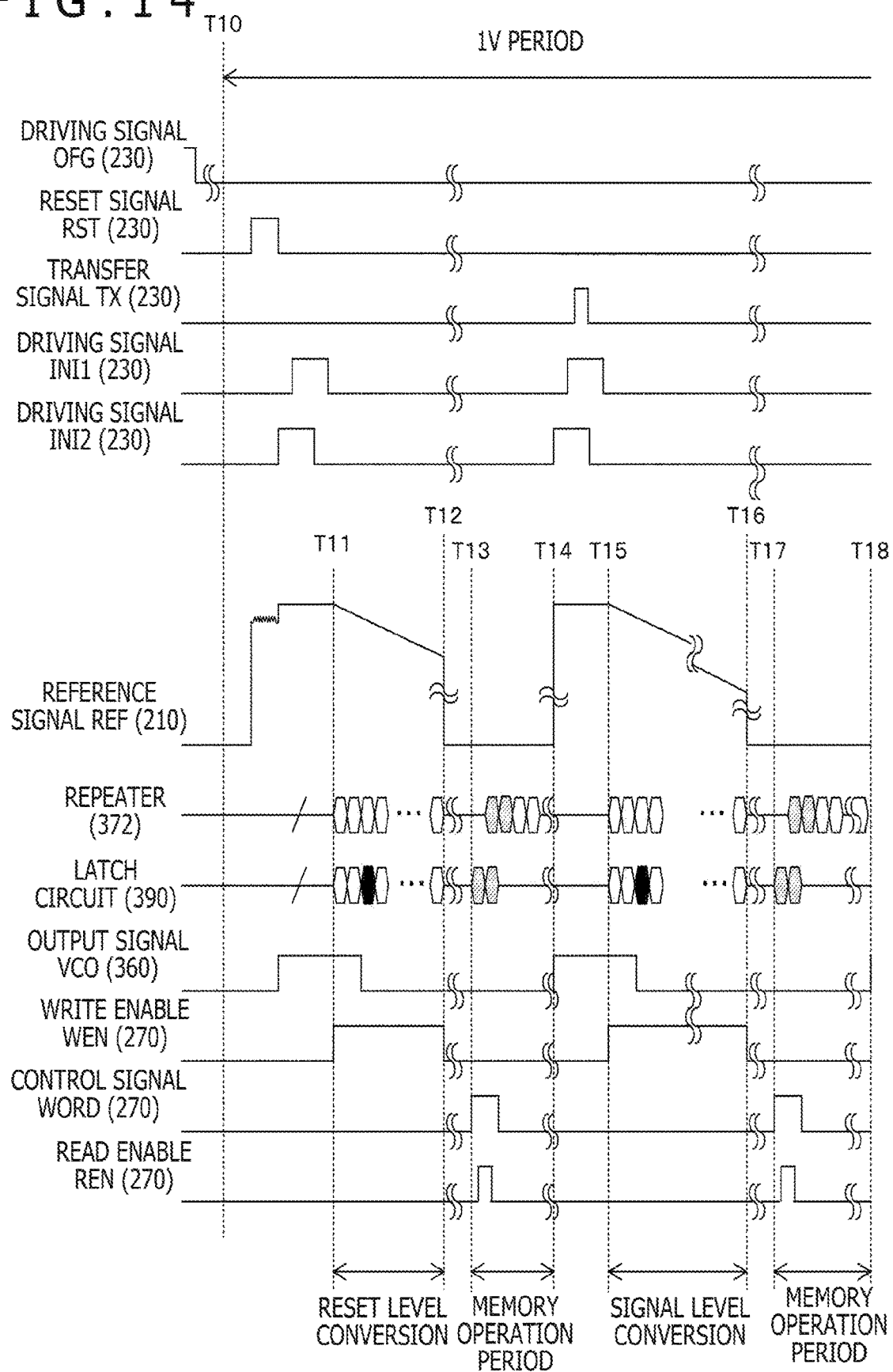
FIG. 14 is a timing chart indicating one example of an operation of the solid-state imaging element according to the first embodiment of the present technology.

FIG. 14 is a timing chart of one example of an operation of the solid-state imaging element 200 according to the first embodiment of the present technology. It is assumed that a cycle of the vertical synchronized signal VSYNC is a 1V period.

The driving circuit 230 supplies a driving signal OFG before timing T10 at a start of the 1V period to start exposure of the pixel circuit 310. The driving circuit 230 supplies a reset signal RST after timing T10 to cause the pixel circuit 310 to generate an analog pixel signal. A level of the pixel signal at this time will be referred to as a reset level.

The ADC 320 converts the reset level into a digital signal during a period from timing T11 to timing T12.

Thereafter, the memory 280 updates retained data according to the reset level after AD conversion during a period from timing T13 to timing T14.

The driving circuit 230 supplies the transfer signal TX at an end of exposure immediately after timing T14. As a result, a charge is transferred to the FD 312 to generate an analog pixel signal corresponding to a received light amount. A level of the pixel signal at this time will be referred to as a signal level.

The ADC 320 converts the signal level into a digital signal during a period from timing T15 to timing T16.

Subsequently, the memory 280 outputs the reset level after AD conversion to the signal processing unit 250 during a period from timing T17 to timing T18. Thereafter, the signal processing unit 250 calculates a difference between the reset level and the signal level and supplies the difference to the memory 280. The memory 280 updates retained data according to the difference.

As depicted in FIG. 14 by way of example, the operation period of AD conversion of the reset level and the signal level by the ADC 320 is different from the operation period of update of data by the memory 280. Accordingly, even if these circuits are disposed on the P-wells adjacent to each other, noise generated during the operation period of one of the circuits does not affect the other circuit.

As described above, according to the first embodiment of the present technology, the ADC 320 and the memory 280 having different noise-generated periods are disposed on the P-wells 420 and 450 adjacent to each other, respectively. Accordingly, malfunction of one circuit caused by noise generated in the other circuit can be reduced.

2. Second Embodiment

According to the first embodiment described above, the memory 280 is disposed as a circuit which has a noise-generated period different from that period of the ADC 320. However, the memory 280 may be difficult to be disposed at a position adjacent to the ADC 320 due to limitation of layout. The solid-state imaging element 200 of the second embodiment is different from that of the first embodiment in that an output control unit 260 is disposed in place of the memory 280.

Figure 15:
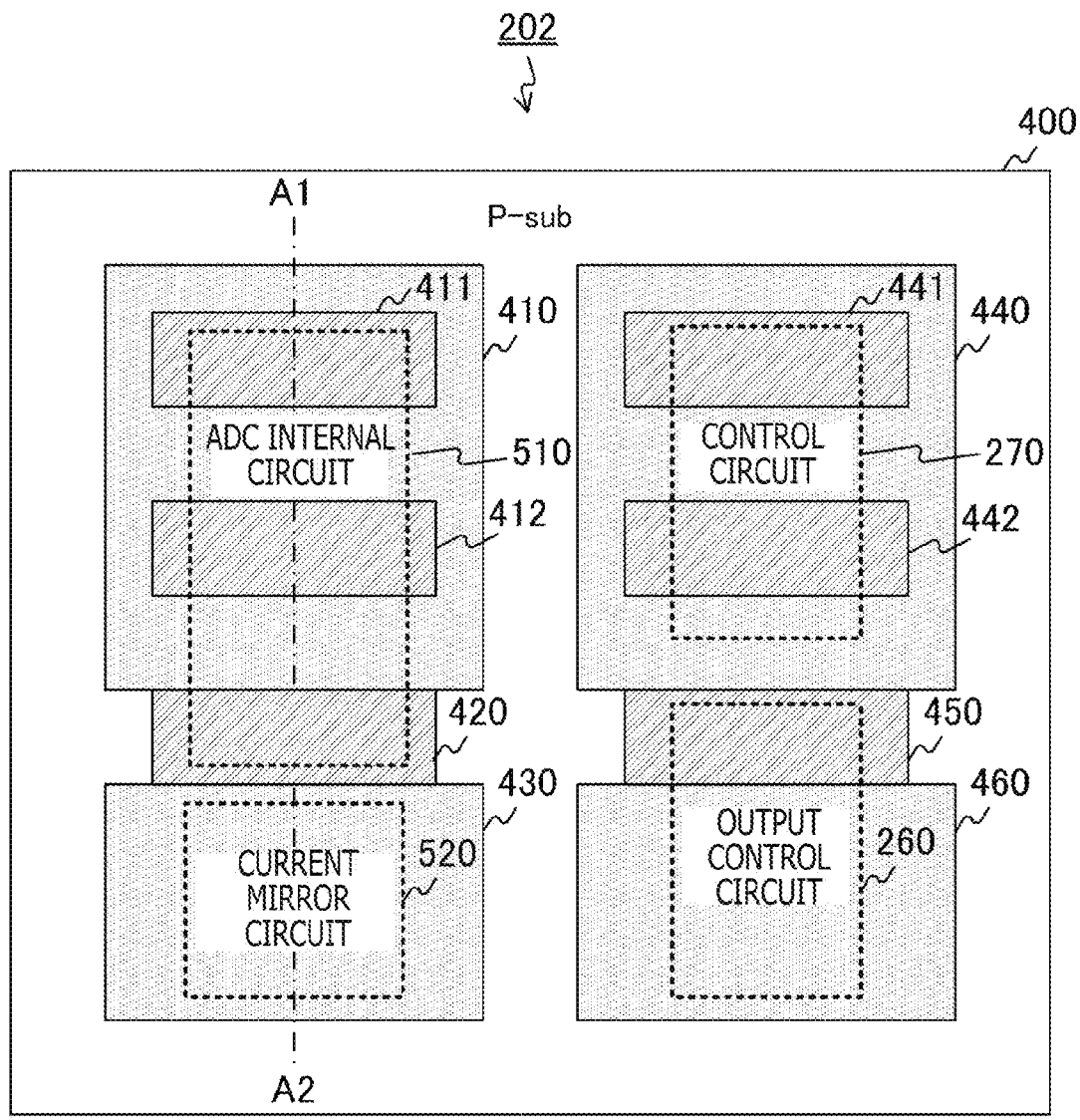
FIG. 15 is one example of a plan diagram depicting a P-type substrate according to a second embodiment of the present technology.

FIG. 15 is one example of a plan diagram depicting the P-type substrate 400 according to the second embodiment of the present technology. The P-type substrate 400 of the second embodiment is different from that of the first embodiment in that the output control unit 260 is disposed on the P-well 450 and the N-well 460 in place of the memory 280.

Figure 16:
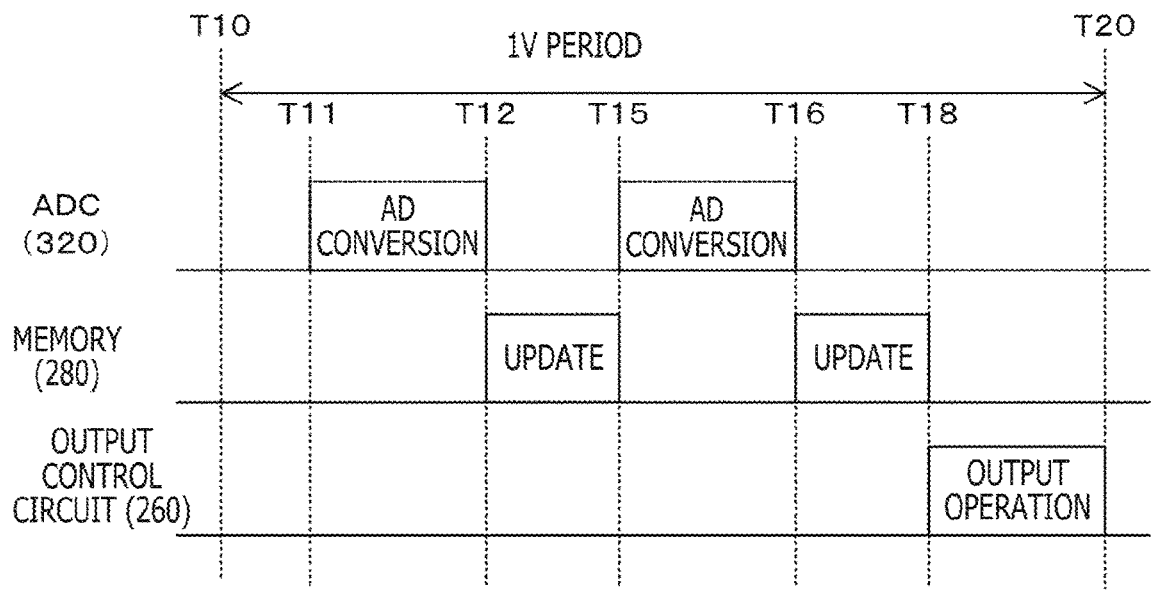
FIG. 16 is a timing chart indicating one example of an operation of a solid-state imaging element according to the second embodiment of the present technology.

FIG. 16 is a timing chart indicating one example of an operation of the solid-state imaging element 200 according to the second embodiment of the present technology. The ADC 320 converts a reset level into a digital signal during a period from timing T11 to timing T12 included in a 1V period from timing T10 to timing T20.

The memory 280 updates retained data according to the reset level after AD conversion during a period from timing T12 to timing T15.

The ADC 320 converts a signal level into a digital signal during a period from timing T15 to timing T16.

The memory 280 updates retained data according to a difference between the reset level and the signal level during a period from timing T16 to timing T18.

The output control unit 260 outputs pixel data indicating the difference to the outside during a period from timing T18 to timing T20. Noise is generated in the output control unit 260 in this period. Note that the signal processing unit 250 or the like may perform signal processing or the like before output to the outside to further perform a process for narrowing a data band.

As depicted in FIG. 15 by way of example, the noise-generated operation periods of the ADC 320 and the output control unit 260 are different from each other. Accordingly, even if the ADC 320 and the output control unit 260 are disposed on the P-wells 420 and 450 adjacent to each other, respectively, noise generated during the operation period of one of the circuits does not affect the other circuit.

As described above, according to the second embodiment, the ADC 320 and the output control unit 260 having different noise-generated periods are disposed on the P-wells 420 and 450 adjacent to each other, respectively. Accordingly, malfunction of one circuit caused by noise generated in the other circuit can be reduced.

3. Third Embodiment

According to the first embodiment described above, the circuits on the solid-state imaging element 200 are dispersedly disposed on the two chips of the light reception chip 201 and the circuit chip 202. However, the circuit scale may become larger for each chip as the number of the pixels increases. The solid-state imaging element 200 of the third embodiment is different from that of the first embodiment in that the circuits within the solid-state imaging element 200 are dispersedly disposed on three laminated chips.

Figure 17:
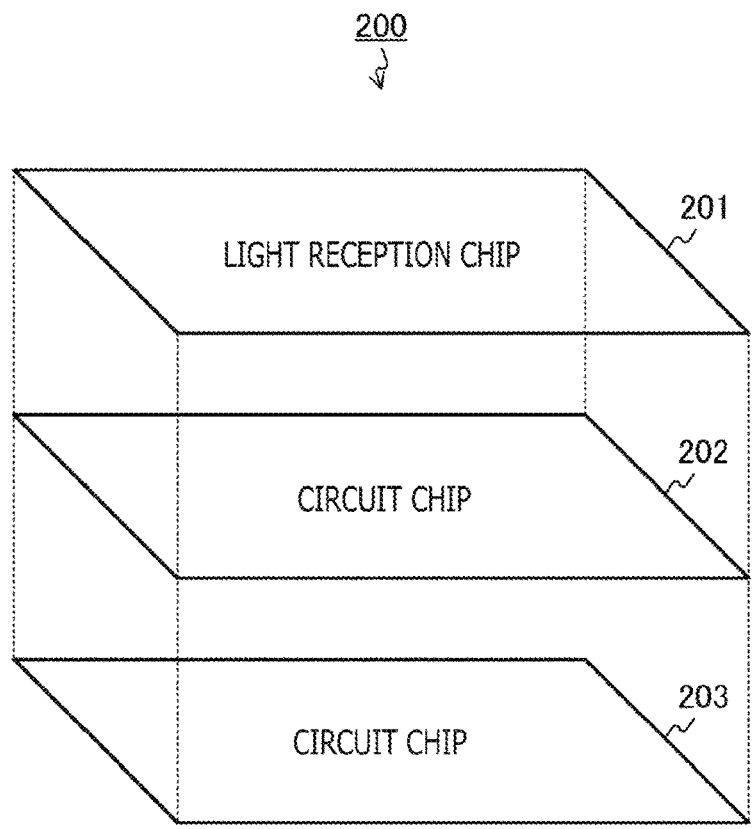
FIG. 17 is a diagram depicting one example of a laminated structure of a solid-state imaging element according to a third embodiment of the present technology.

FIG. 17 is a block diagram depicting one example of a laminated structure of a solid-state imaging element 200 according to the third embodiment of the present technology. The solid-state imaging element 200 of the third embodiment is different from that of the first embodiment in that a circuit chip 203 is further laminated.

Figure 18:
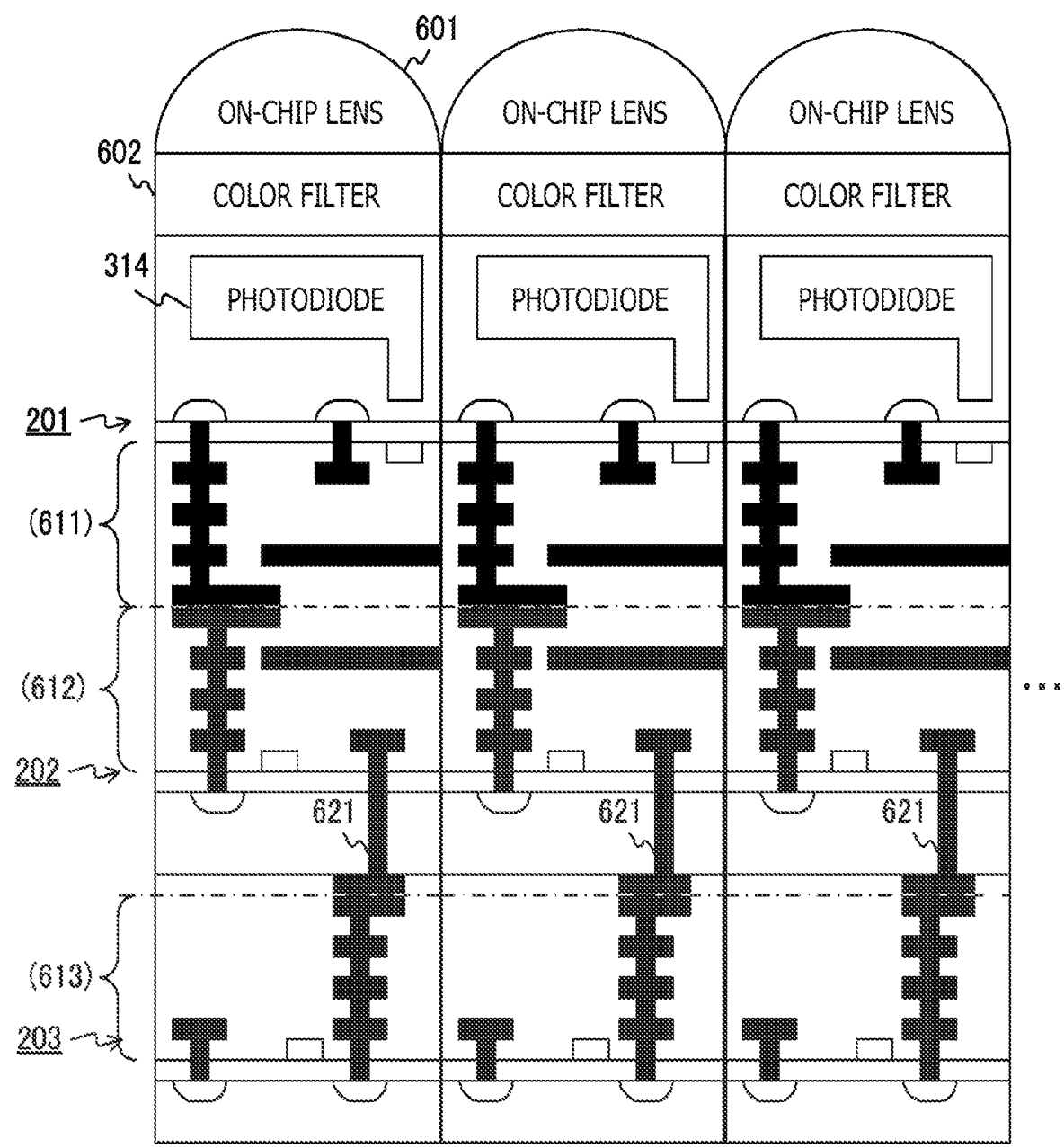
FIG. 18 is a diagram depicting one example of a cross-sectional diagram of a pixel according to the third embodiment of the present technology.

FIG. 18 is a diagram depicting one example of a cross-sectional diagram of a pixel according to the third embodiment of the present technology. An on-chip lens 601, a color filter 602, the photodiode 314, and a wiring layer 611 are provided on the light reception chip 201. Moreover, a wiring layer 612 is provided on the circuit chip 202. The light reception chip 201 and the circuit chip 202 are affixed to each other by Cu—Cu bonding at a portion indicated by a one-dot chain line.

Furthermore, a wiring layer 613 is provided on the circuit chip 203. The circuit chip 202 and the circuit chip 203 are affixed to each other by Cu—Cu bonding at a portion indicated by a one-dot chain line. In addition, the wiring layer 613 is connected with the wiring layer 612 via through electrodes 621. A circuit arrangement method for the respective chips is not limited to a particular method. For example, the current mirror circuit and circuits in following stages disposed on the circuit chip 202 in FIG. 6 are dispersedly disposed on the circuit chips 202 and 203.

As described above, the circuits within the solid-state imaging element 200 are dispersedly disposed on the three chips in the third embodiment of the present technology. Accordingly, the circuit scale for each chip can be more reduced than in the first embodiment.

4. Fourth Embodiment

According to the first embodiment described above, the control circuit 270 supplies a clock signal having a fixed frequency to the time code generation unit 220, and the time code generation unit 220 counts a count value in synchronization with the clock signal and generates a time code. However, the counting period increases as intensity of illumination becomes higher. In this case, power consumption may increase. The solid-state imaging element 200 of a fourth embodiment described herein is different from that of the first embodiment in that a frequency of a clock signal is varied with an elapse of time to reduce power consumption.

Figure 19:
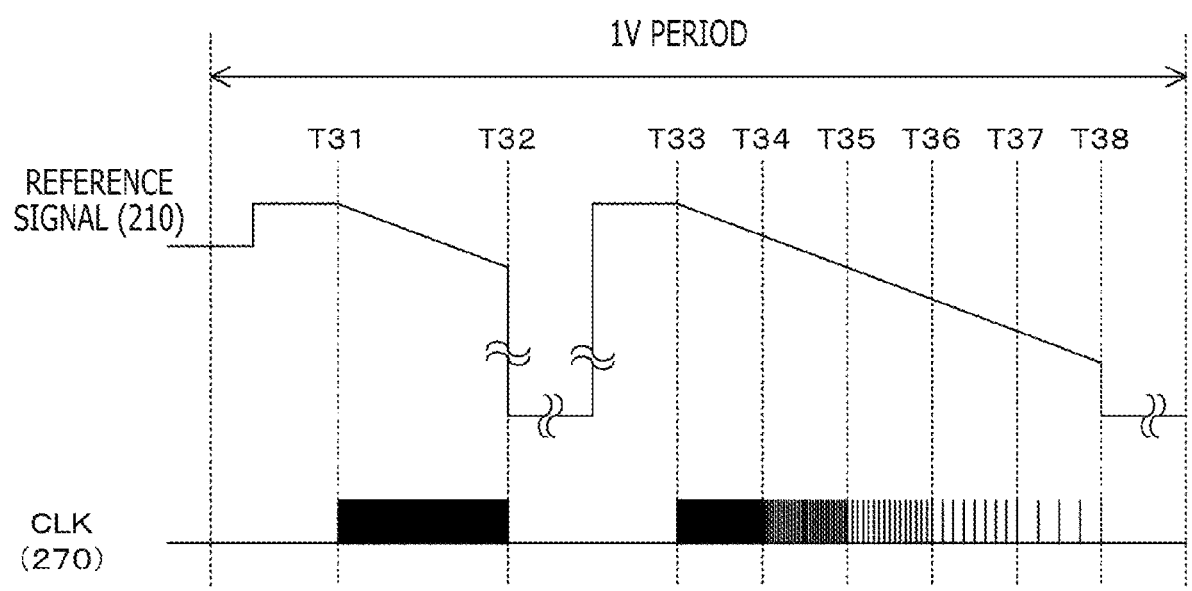
FIG. 19 is a timing chart indicating one example of operations of a DAC (Digital Analog Converter) and a control circuit according to the second embodiment of the present technology.

FIG. 19 is a timing chart indicating one example of an operation of the DAC 210 and the control circuit 270 according to the fourth embodiment of the present technology.

The DAC 210 supplies a slope-shaped reference signal REF in a period for converting a reset level from timing T31 to timing T32 and a period for converting a signal level from timing T33 to timing T38 in a 1V period.

Moreover, the control circuit 270 varies (or lowers, for example) a frequency of a clock signal CLK for the time code generation unit 220 with an elapse of time in a period for converting the signal level from T33 to T38. For example, the frequency of the clock signal CLK is F hertz (Hz) in a period from T31 to T32 and a period from T33 to T34. The frequency of the clock signal CLK lowers to F/2 hertz (Hz) in a period from T34 to T35. The frequency of the clock signal CLK lowers to F/4 hertz (Hz) in a period from T35 to T36. The frequency of the clock signal CLK lowers to F/8 hertz (Hz) in a period from T36 to T37. The frequency of the clock signal CLK lowers to F/16 hertz (Hz) in a period from T37 to T38.

In this manner, the time code generation unit 220 counts a count value and generates a time code of this count value in synchronization with the clock signal CLK having a variable frequency. Accordingly, the time code exhibits rougher transitions as the intensity of illumination increases, and the number of times of counting decreases in comparison with a case where the frequency is not lowered. In this manner, reduction of power consumption of the time code generation unit 220 is achievable.

As described above, according to the fourth embodiment of the present technology, the time code generation unit 220 generates a time code in synchronization with the clock signal CLK which has a frequency variable with an elapse of time. Accordingly, more reduction of power consumption is achievable than in a case where the frequency is fixed.

5. Application Example to Mobile Body

The technology according to the present disclosure (present technology) applicable to various products. For example, the technology according to the present disclosure may be implemented as a device mounted on a mobile body of any of types such as a car, an electric car, a hybrid electric car, a motorcycle, a bicycle, a personal mobility, an airplane, a drone, a vessel, and a robot.

Figure 20:
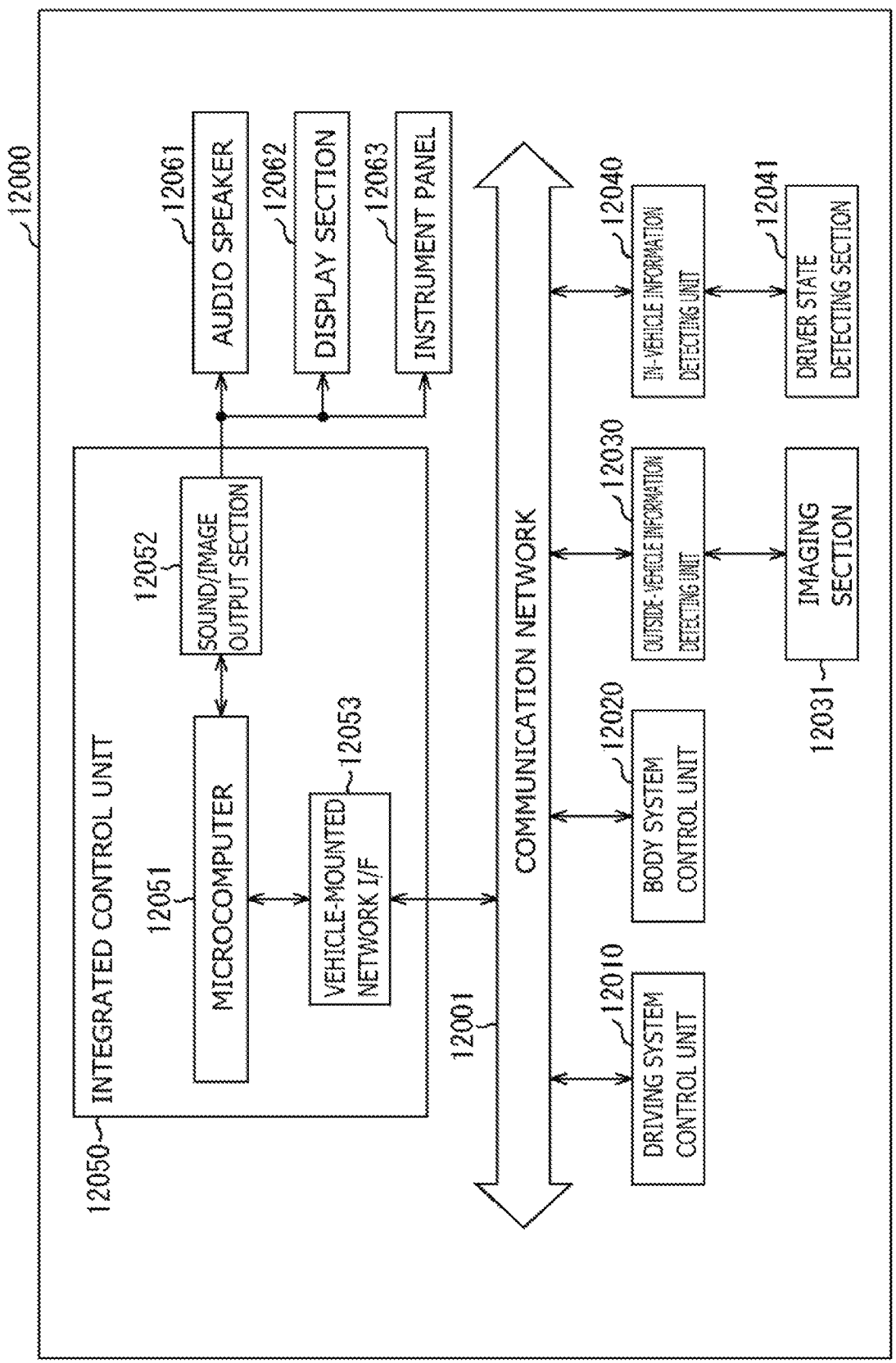
FIG. 20 is a block diagram depicting an example of schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

Figure 21:
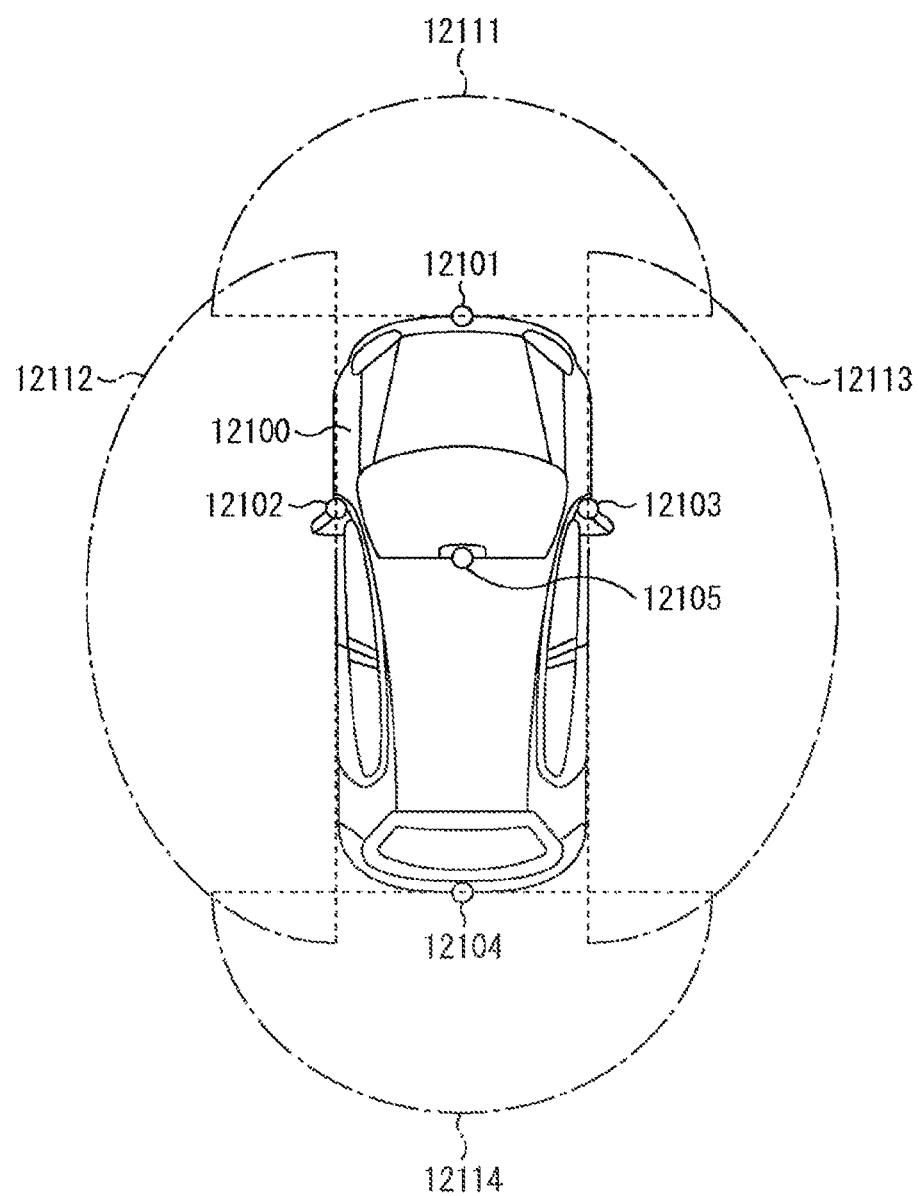
FIG. 21 is a diagram of assistance in explaining an example of installation positions of an outside-vehicle information detecting section and an imaging section.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure is applicable has been described above. The technology according to the present disclosure is applicable to the imaging section 12031 in the configuration described above. Specifically, the imaging device 100 in FIG. 1 is applicable to the imaging section 12031. Area efficiency can be raised by applying the technology of the present disclosure to the imaging section 12031. Accordingly, performance of the imaging section 12031 can improve.

Note that each of the embodiments described above presents one example practicing the present technology. Matters of the embodiments and specific inventive matters of the patent claims have a correspondence relationship. Similarly, specific inventive matters of the patent claims and matters included in the embodiments of the present technology and given names identical to corresponding names of the specific inventive matters have a correspondence relationship. However, the present technology is not limited to the embodiments and may be practiced by modifying the embodiments in various manners without departing from the subject matters of the present technology.

Note that advantageous effects described in the present description are presented only by way of example. Advantageous effects to be produced are not limited to these advantageous effects, but may include other advantageous effects.

Note that the present technology may also have following configurations.

(1)

A solid-Late imaging element including:

a first well that contains an impurity having a polarity identical to a polarity of an impurity in a substrate;

a second well that contains an impurity having a polarity identical to the polarity of the impurity in the substrate and that is disposed adjacent to the first well;

a first circuit that is disposed on the first well and generates noise in a predetermined period; and a second circuit that is disposed of the second well and generates noise in a period different from the predetermined period.

(2)

The solid-state imaging element according to (1) described above, in which the first circuit includes an analog-digital converter that converts an analog signal into a digital signal in the predetermined period.

(3)

The solid-state imaging element according to (2) described above, further including:

a time code generation unit that counts a count value and generates a time code indicating the count value in synchronization with a clock signal having a frequency variable with an elapse of time, in which the analog-digital converter includes a comparator that compares the analog signal with a predetermined reference signal and outputs a comparison result, and a data storage unit that stores the time code at a time of inversion of the comparison result as the digital signal.

(4)

The solid-state imaging element according to any one of (1) to (3) described above, in which the second circuit includes a memory that retains data and updates the data in a period different from the predetermined period.

(5)

The solid-state imaging element according to any one of (1) to (4) described above, in which the second circuit includes an output control unit that outputs data in a period different from the predetermined period.

(6)

The solid-state imaging element according to any one of (1) to (5) described above, further including:
a third well that contains an impurity having a polarity opposite to the polarity of the impurity in the substrate; and
a control circuit that is disposed on the third well and controls operations of the first circuit and the second circuit.

(7)

The solid-state imaging element according to (1) described above, further including:
a pixel circuit that generates an analog signal by photoelectric conversion, in which
the pixel circuit is disposed on a predetermined light reception chip, and
the first circuit and the second circuit are disposed on a chip laminated on the light reception chip.

(8)

The solid-state imaging element according to (7) described above, in which the first circuit and the second circuit are dispersedly disposed on a plurality of circuit chips laminated on the light reception chip.

(9)

An imaging device including:
a first well that contains an impurity having a polarity identical to a polarity of an impurity in a substrate;
a second well that contains an impurity having a polarity identical to the polarity of the impurity in the substrate and that is disposed adjacent to the first well;
a first circuit that is disposed on the first well and generates noise in a predetermined period;
a second circuit that is disposed in the second well and generates noise in a period different from the predetermined period; and
a pixel circuit that generates a predetermined analog signal by photoelectric conversion and supplies the generated predetermined analog signal to the first circuit.

REFERENCE SIGNS LIST 100 imaging device
110 Optical unit
120 DSP circuit
130 Display unit
140 Operation unit
150 Bus
160 Frame memory
170 Storage unit
180 Power source unit
200 Solid-state imaging element
201 Might reception chip
202, 203 Circuit chip
210 DAC
220 Time code generation unit
230 Driving circuit
240 Pixel array unit
241 Time code transfer unit
250 Signal processing unit
260 Output control unit
270 Control circuit
280 Memory
300 Pixel
310 Pixel circuit
311 Reset transistor
312 FD
313 Transfer transistor
314 Photodiode
315 Discharge transistor
320 ADC
321 Comparison circuit
330 Differential input circuit
331, 334, 336, 351, 352, 361 PMOS transistor
332, 333, 335, 341, 353, 362 NMOS transistor
340 Voltage conversion circuit
350 Positive feedback circuit
360, 382, 383, 392, 393 Inverter
370 Data storage unit
371 Bidirectional buffer
372 Repeater
380 Latch control circuit
381 NOR (NOR operation) gate
390 Latch circuit
391 Switch
400 P-type substrate
510 ADC internal circuit
511, 513 PMOS block
512, 514 NMOS block
520 Current mirror circuit
601 On-chip lens
602 Color filter
611, 612, 613 Wiring layer
621 Through electrode
12031 Imaging section

The invention claimed is:

1. A solid-state imaging element, comprising:
a first well that contains an impurity having a polarity identical to a polarity of an impurity in a substrate;
a second well that contains an impurity having a polarity identical to the polarity of the impurity in the substrate and that is disposed adjacent to the first well;
a first circuit that is disposed on the first well and generates noise in a predetermined period; and
a second circuit that is disposed on the second well and generates noise in a period different from the predetermined period.

2. The solid-state imaging element according to claim 1, wherein the first circuit includes an analog-digital converter that converts an analog signal into a digital signal in the predetermined period.

3. The solid-state imaging element according to claim 2, further comprising:
a time code generation unit that counts a count value and generates a time code indicating the count value in synchronization with a clock signal having a frequency variable with an elapse of time, wherein
the analog-digital converter includes
a comparator that compares the analog signal with a predetermined reference signal and outputs a comparison result, and
a data storage unit that stores the time code at a time of inversion of the comparison result as the digital signal.

4. The solid-state imaging element according to claim 1, wherein the second circuit includes a memory that retains data and updates the data in a period different from the predetermined period.

5. The solid-state imaging element according to claim 1, wherein the second circuit includes an output control unit that outputs data in a period different from the predetermined period.

6. The solid-state imaging element according to claim 1, further comprising:
- a third well that contains an impurity having a polarity opposite to the polarity of the impurity in the substrate; and
- a control circuit that is disposed on the third well and controls operations of the first circuit and the second circuit.

7. The solid-state imaging element according to claim 1, further comprising:
- a pixel circuit that generates an analog signal by photoelectric conversion, wherein
- the pixel circuit is disposed on a predetermined light reception chip, and
- the first circuit and the second circuit are disposed on a chip laminated on the light reception chip.

8. The solid-state imaging element according to claim 7, wherein the first circuit and the second circuit are dispersedly disposed on a plurality of circuit chips laminated on the light reception chip.

9. An imaging device, comprising:
- a first well that contains an impurity having a polarity identical to a polarity of an impurity in a substrate;
- a second well that contains an impurity having a polarity identical to the polarity of the impurity in the substrate and that is disposed adjacent to the first well;
- a first circuit that is disposed on the first well and generates noise in a predetermined period;
- a second circuit that is disposed in the second well and generates noise in a period different from the predetermined period; and
- a pixel circuit that generates a predetermined analog signal by photoelectric conversion and supplies the generated predetermined analog signal to the first circuit.

* * * * *